(12) United States Patent
Watanabe et al.

(10) Patent No.: US 8,592,133 B2
(45) Date of Patent: Nov. 26, 2013

(54) RESIST COMPOSITION AND PATTERNING PROCESS

(75) Inventors: Satoshi Watanabe, Jyoetsu (JP); Akinobu Tanaka, Jyoetsu (JP); Takeru Watanabe, Jyoetsu (JP); Takeshi Kinsho, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/427,621

(22) Filed: Mar. 22, 2012

(65) Prior Publication Data

US 2012/0183892 A1 Jul. 19, 2012

Related U.S. Application Data

(63) Continuation of application No. 12/457,192, filed on Jun. 3, 2009, now Pat. No. 8,168,367.

(30) Foreign Application Priority Data

Jul. 11, 2008 (JP) ................................. 2008-181509

(51) Int. Cl.
| | |
|---|---|
| G03F 7/00 | (2006.01) |
| G03F 7/20 | (2006.01) |
| G03F 7/028 | (2006.01) |
| G03F 7/40 | (2006.01) |
| G03F 1/08 | (2006.01) |

(52) U.S. Cl.
USPC ............ 430/270.1; 430/5; 430/311; 430/905; 430/913; 430/945

(58) Field of Classification Search
USPC ................... 430/5, 270.1, 913, 311
See application file for complete search history.

(56) References Cited

U.S. PATENT DOCUMENTS

| | | | |
|---|---|---|---|
| 4,363,846 | A | 12/1982 | Kaneki |
| 5,580,695 | A | 12/1996 | Murata et al. |
| 5,650,483 | A | 7/1997 | Malik et al. |
| 6,887,646 | B1 | 5/2005 | Fujiwara et al. |
| 8,168,367 | B2 | 5/2012 | Watanabe et al. |
| 2001/0036591 | A1 | 11/2001 | Schulz et al. |
| 2003/0165751 | A1 | 9/2003 | Elian et al. |
| 2004/0012872 | A1 | 1/2004 | Fleming et al. |
| 2004/0106063 | A1 | 6/2004 | Hatakeyama et al. |
| 2004/0185349 | A1 | 9/2004 | Yang |
| 2006/0166133 | A1 | 7/2006 | Koitabashi et al. |
| 2008/0070132 | A1 | 3/2008 | Hashimoto et al. |
| 2008/0096128 | A1 | 4/2008 | Takeda et al. |
| 2008/0274422 | A1 | 11/2008 | Masunaga et al. |
| 2009/0004608 | A1 | 1/2009 | Sawada et al. |
| 2009/0047584 | A1 | 2/2009 | Hashimoto |
| 2012/0183892 | A1 | 7/2012 | Watanabe et al. |

FOREIGN PATENT DOCUMENTS

| | | |
|---|---|---|
| CN | 1276541 A | 12/2000 |
| CN | 1306224 A | 8/2001 |
| CN | 1825206 A | 8/2006 |
| CN | 1906537 A | 1/2007 |
| EP | 0 708 368 A1 | 4/1996 |
| EP | 0 887 705 A1 | 12/1998 |
| EP | 1 039 346 A1 | 9/2000 |
| EP | 1 684 118 A1 | 7/2006 |
| EP | 1 775 632 A1 | 4/2007 |
| GB | 2 352 825 A | 2/2001 |
| JP | A 05-061193 | 3/1993 |
| JP | A 05-165218 | 7/1993 |
| JP | A-5-232706 | 9/1993 |
| JP | A-5-289340 | 11/1993 |
| JP | A 2002-214769 | 7/2002 |
| JP | A 2002-372783 | 12/2002 |
| JP | A 2003-122011 | 4/2003 |
| JP | A 2005-326833 | 11/2005 |
| JP | A 2006-201532 | 8/2006 |
| JP | A-2007-171520 | 7/2007 |
| JP | A-2007-522524 | 8/2007 |
| JP | A 2008-102383 | 5/2008 |
| JP | A 2008-111103 | 5/2008 |
| JP | A 2008-276045 | 11/2008 |
| KR | 10-0753350 B1 | 8/2007 |
| KR | 10-0781067 B | 11/2007 |
| WO | WO 2005/088393 A1 | 9/2005 |
| WO | WO 2007/080726 A1 | 7/2007 |

OTHER PUBLICATIONS

Hatakeyama et al., "Investigation of Discrimination Enhancement with New Modeling for Poly-Hydroxystyrene Positive Resists," *Journal of Photopolyiner Science and Technology*, vol. 13, No. 4, 2000, pp. 519-524.

Oct. 28, 2009 Search Report issued in European Patent Application No. 09007469.1.

(Continued)

*Primary Examiner* — Amanda C. Walke

(74) *Attorney, Agent, or Firm* — Oliff & Berridge, PLC

(57) ABSTRACT

The present invention relates to: a resist composition such as a chemically amplified resist composition for providing an excellent pattern profile even at a substrate-side boundary face of resist, in addition to a higher resolution in photolithography for micro-fabrication, and particularly in photolithography adopting, as an exposure source, KrF laser, ArF laser, $F_2$ laser, ultra-short ultraviolet light, electron beam, X-rays, or the like; and a patterning process utilizing the resist composition. The present invention provides a chemically amplified resist composition comprising one or more kinds of amine compounds or amine oxide compounds (except for those having a nitrogen atom of amine or amine oxide included in a ring structure of an aromatic ring) at least having a carboxyl group and having no hydrogen atoms covalently bonded to a nitrogen atom as a basic center.

30 Claims, No Drawings

(56) References Cited

OTHER PUBLICATIONS

Jul. 31, 2012 Notification of Going through the Formalities of Registration, Notification of Granting Patent Right and Search Report issued in Chinese Patent Application No. 200910140187.4 (with translation).
Dec. 28, 2012 Office Action issued in Chinese Patent Application No. 201110442517.2 (with partial English translation).
Mar. 14, 2013 Office Action issued in U.S. Appl. No. 13/427,653.
Mar. 15, 2013 Search Report issued in Chinese Patent Application No. 2011104425011 (with English-language Translation).
Jan. 24, 2013 Korean Office Action issued in Application No. 10-2011-136024 (with partial English-language Translation).
Deogbae, K., "Effects of Quencher Ability on Profile in Chemically Amplified Resist System," *Proceedings of SPIE*, 2003, pp. 1086-1097, vol. 5039, International Society for Optical Engineering, USA.
Extended European Search Report issued in European Patent Appln. No. 09007469.1 on Jan. 29, 2010.
European Search Report dated Oct. 5, 2010 in European Patent Appln. No, 10006242.1.
Written Opinion dated Oct. 13, 2010 in Singaporean Patent Appln. No. 2009-038944.
European Search Report dated Oct. 6, 2010 in European Patent Appln. No. 10006243.9.
European Search Report dated Oct. 13, 2010 in European Patent Appln. No. 10006255.3.
European Search Report dated Nov. 30, 2010 in European Patent Appln. No. 10006254.6.
Japanese Office Action issued in Japanese Patent Appln. No. 2011-040141 dated Apr. 26, 2011 (with partial translation).
Translation of JP 2003-112011 (no date).
Aug. 11, 2011 Office Action issued in Chinese Patent Appln. No. 2009101401874 (with translation).
Jul. 23, 2013 Office Action issued in Korean Patent Application No. 10-2009-63008 (with partial translation).
Aug. 16, 2013 Office Action issued in Taiwanese Patent Application No. 098123530 (with partial translation).

RESIST COMPOSITION AND PATTERNING PROCESS

This is a Continuation of application Ser. No. 12/457,192 filed Jun. 3, 2009. The disclosure of the prior application is hereby incorporated by reference herein in its entirety.

BACKGROUND OF THE INVENTION

1. Field of the Invention

The present invention relates to a photoresist to be used for micro-fabrication of semiconductors, photomask blanks, and the like, and particularly to a chemically amplified positive or negative resist to be used for precisely conducting micro-fabrication by ultraviolet rays, EUV, electron beam exposure at wavelengths of 300 nm or shorter.

2. Description of the Related Art

It is known that finer pattern rules are demanded with highly integrated LSPs providing highly increased speeds. This has correspondingly led to largely changed exposure methods and resist compositions, and particularly, KrF, ArF excimer laser light, electron beam, and the like are used as exposure light sources upon conduction of lithography of patterns at 0.2 µm or less, in a manner to adopt chemically amplified photoresists, which exhibit excellent sensitivities to such high energy radiations and provide higher resolutions.

However, chemically amplified resist compositions are defectively accompanied by: a problem (called PED [Post Exposure Delay]) such that extended standing-still periods from exposure to PEB (post-exposure bake) lead to T-topped shapes of line patterns upon formation of positive patterns, i.e., lead to patterns having thickened upper portions; or a problem, which is a so-called footing phenomenon where patterns are thickened near a substrate, such as a substrate formed with metal like Al, Cr, or the like, or a basic substrate, particularly a silicon nitride substrate or titanium nitride substrate, The T-topped phenomenon is considered to be due to a decreased solubility of a resist film surface, while the footing at a substrate surface is considered to be due to a decreased solubility of the resist near the substrate.

In turn, upon formation of a negative pattern, there is caused a so-called undercut phenomenon where a cross-linking reaction of a negative resist is decreased near a substrate such that the pattern is subjected to constriction at a substrate-side boundary face of resist.

In case of chemically amplified positive resist compositions, the reason of the problem of PED or footing profile at a substrate surface is considered to be largely affected by a basic compound in air or at a substrate surface. Acids generated by exposure at a resist film surface react with basic compounds in air and are inactivated, such that longer standing-still times until PEB correspondingly increase amounts of acids to be inactivated, to scarcely cause decomposition of acid labile groups. As such, hardly soluble layers are formed at surfaces of resists, so that patterns are brought into T-topped shapes, respectively.

Against this problem, it is well known that addition of a nitrogen-containing compound allows for restriction of an influence of basic compounds in air, and this is also effective to PED (see Japanese Patent Application Laid-open (kokai) No. H05-232706, for example). Particularly, amine compounds or amide compounds have been noticed as nitrogen-containing compounds having higher addition effects, and numerous concrete compounds have been proposed.

Although it has been proposed to use a relatively weak base against the above-mentioned T-topped problem, the weak base is insufficient for control of deprotection reaction within a resist film, i.e., for control of diffusion of acids for causing a catalytic reaction, in case of adoption of acid labile groups having higher reactivities to be used for obtaining higher resolutions. Addition of weak base particularly results in progression of dark reaction in FED even at an non-exposed area, thereby causing a decrease of line dimension (slimming) and a film decrease at line surface in PED. To solve this problem, it is desirable to add a strong base. However, stronger basicities are not necessarily preferable, such that a sufficient effect can not be obtained even by addition of DBU (1,8-diazabicyclo[5.4.0]-7-undecene) or DBN (1,5-diazabicyclo[4.3.0]-5-nonene), which are regarded as being super base, or proton sponge (1,8-bis(dimethylamino)naphthalene), or quaternary ammonium hydroxides such as tetramethylammonium hydroxide.

Meanwhile, it is effective to add a nitrogen-containing compound having an improved effect for capturing generated acids, for increased contrasts for achieving higher resolutions. Although a dissociation constant between acid and base in water can be explained by pKa, an acid-capturing ability and pKa of a nitrogen-containing compound in a resist film are not directly related to each other. This has been stated by Hatakeyama et al., in a J. Hatakeyama, et. al., J. Photopolym. Sci. Technol., 13(4), 519-524 (2000). It has been additionally recognized that types of nitrogen-containing organic compounds to be used largely affect pattern profile.

Concerning pattern profile in substrate-side boundary face of resists, although problems of footing profile and undercut are improved by addition of base, the improvement is insufficient. While further increase of addition amounts of base will result in further improvement, there is caused a tradeoff problem of a considerably deteriorated sensitivity.

In turn, to solve a problem of footing profile of a resist pattern on a light-shielding film of a photomask upon fabrication of the light-shielding film, it has been disclosed that formation of a polymeric undercoat on a sputteredly deposited metal compound results in obtainment of a pattern without footing (Japanese Patent Application Laid-open (kokai) No. 2007-171520). However, the countermeasure on a substrate side requires an increased number of steps for processing, and is problematic not only in a complicated process but also in an increased production cost.

In turn, to improve footing on a Cr substrate of a mask blank, there has been proposed a resist composition combined with a basic additive including a base, which is solid at a room temperature (20 to 25° C.) and a low vapor pressure base, which is liquid at a room temperature (Japanese Patent Application Laid-open (kohyou) No. 2007-522524). Because production processes have been problematically complicated when footing is to be solved by the countermeasure on a substrate side, it is important that the problem is solved by a countermeasure on a resist composition side. However, adoption of the low vapor pressure base leads to evaporation of the base at a prebaking temperature, thereby occasionally causing a sensitivity change by a concentration change. This makes it difficult to keep dimensions of a pattern with higher precision.

Further, at an early stage of elaboration of chemically amplified resists during a proposal period of various basic compounds, there has been proposed addition of amino acid, 3-aminopyrazine-2-carboxylic acid, or the like, as a compound having an amino group and a carboxyl group (Japanese Patent Application Laid-open (kokai) No. H05-289340). However, there have not been found important proposals thereafter to use such an amine compound having a carboxyl group, and such a situation is considered to be due to failure of remarkable effects by such usage in seeking for a higher resolution.

SUMMARY OF THE INVENTION

The present invention has been carried out in view of the above circumstances, and it is therefore an object of the present invention to provide: a resist composition for (1) a chemically amplified positive resist composition, which is made soluble in alkali upon elimination of an acid labile group by an acid catalyst, and (2) a chemically amplified negative resist composition, which is made insoluble in alkali by an acid catalyst and/or which is made insoluble in alkali by reaction with a crosslinking agent by an acid catalyst, such that the resist composition provides, by addition of the above-mentioned basic component, an excellent pattern profile even at a substrate-side boundary face of resist, in addition to a higher resolution in photolithography for micro-fabrication, and particularly in photolithography adopting, as an exposure source, KrF laser, ArF laser, $F_2$ laser, ultra-short ultraviolet light, electron beam, X-rays, or the like; and a patterning process utilizing the resist composition.

To achieve the above object, the present inventors have earnestly conducted investigations to narrowly carry out the present invention, by resultingly finding that: adoption of an amine compound or amine oxide compound having a carboxyl group and having no hydrogen atoms covalently bonded to a nitrogen atom as a basic center as a basic component, to be added into a resist composition, allows for formation of a resist film, which resist film is capable of remarkably improving perpendicularity of a line pattern even at a substrate-side boundary face of resist in addition to a higher resolution, and which resist film provides an excellent etching resistance for preserving a pattern profile.

Namely, the present invention resides in a chemically amplified resist composition comprising one or more kinds of amine compounds or amine oxide compounds (except for those having a nitrogen atom of amine or amine oxide included in a ring structure of an aromatic ring) at least having a carboxyl group and having no hydrogen atoms covalently bonded to a nitrogen atom as a basic center.

Although there has been already proposed (see Japanese Patent Application Laid-open (kokai) No. H05-289340) addition of amino acid, 3-aminopyrazine-2-carboxylic acid and the like concerning addition of a compound having an amino group and a carboxyl group, it is impossible to attain a higher resolution by such compounds even when they are intendedly used to do so. Nonetheless, it is possible to realize not only a higher resolution but also an excellent pattern profile exhibiting a less dependency on a material of a substrate surface, in case of adopting, as a basic component, the amine compound or amine oxide compound having a carboxyl group and having no hydrogen atoms covalently bonded to a nitrogen atom as a basic center, according to the present invention.

In this case, the nitrogen atom of the amine compound or amine oxide compound having a carboxyl group and having no hydrogen atoms covalently bonded to a nitrogen atom as a basic center, preferably has three single bonds combined to different carbon atoms, respectively.

Further, as a desirable configuration, the amine compound having a carboxyl group and having no hydrogen atoms covalently bonded to a nitrogen atom as a basic center, may include an amine compound having a carboxyl group represented by the following general formula (1):

Addition of such an amine compound is particularly advantageous to formation of a resist pattern exhibiting an excellent profile having a less dependency on a substrate:

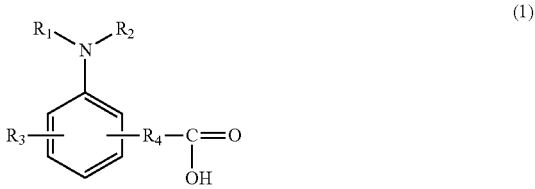

(1)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 0.10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

Furthermore, as one configuration, the amine oxide compound having a carboxyl group and having no hydrogen atoms covalently bonded to a nitrogen atom as a basic center, may include an amine oxide compound having a carboxyl group represented by the following general formula (2):

Addition of such an amine oxide compound is also particularly advantageous to formation of a resist pattern exhibiting an excellent profile having a less dependency on a substrate:

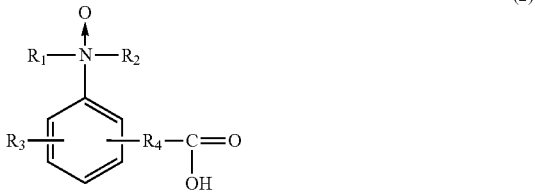

(2)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

As another configuration, the amine compound having a carboxyl group and having no hydrogen atoms covalently bonded to a nitrogen atom as a basic center, may include an amine compound having carboxyl group represented by the following general formula (3)

Addition of such an amine compound is also particularly advantageous to formation of a resist pattern exhibiting an excellent profile having a less dependency on a substrate:

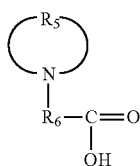
(3)

wherein $R_5$ is a linear or branched substitutable alkylene group having 2 to 20 carbon atoms, wherein the alkylene group may include, between its carbon atoms, one or more carbonyl groups, ether groups, ester groups, or sulfides; and $R_6$ is a linear, branched, or cyclic alkylene group having 1 to 20 carbon atoms, or an arylene group having 6 to 20 carbon atoms.

Namely, the amine compound or amine oxide compound having a carboxyl group and having no hydrogen atoms covalently bonded to a nitrogen atom as a basic center, may include an amine compound or amine oxide compound having a carboxyl group represented by the following general formula (1), (2), or (3):

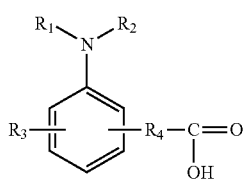
(1)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 car-bon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

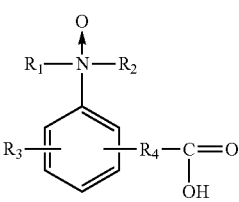
(2)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 car-bon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 car-bon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

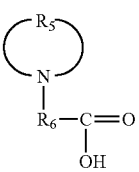
(3)

wherein $R_5$ is a linear or branched substitutable alkylene group having 2 to 20 carbon atoms, wherein the alkylene group may include, between its carbon atoms, one or more carbonyl groups, ether groups, ester groups, or sulfides; and $R_6$ is a linear, branched, or cyclic alkylene group having 1 to 20 carbon atoms, or an arylene group having 6 to 20 carbon atoms.

The chemically amplified resist composition of the present invention may further comprise one or more kinds of amine compounds each represented by the following general formula (4):

Combination of such bases is sometimes advantageous, depending on combination of polymers, acid generators, and the like:

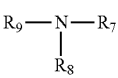
(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

The resist composition may further comprise one or more kinds of amine oxide compounds each represented by the following general formula (5):

Combination with such an amine oxide compound is sometimes advantageous:

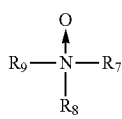
(5)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

Namely, the chemically amplified resist composition may further comprise one or more kinds of amine compounds or amine oxide compounds each represented by the following general formula (4) or general formula (5):

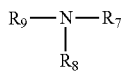
(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

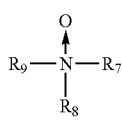
(5)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

Further, the present invention provides a chemically amplified positive resist composition containing, as main components:

(A1) a base resin insoluble or hardly soluble in alkali, having an acidic functional group protected by an acid labile group, wherein the resin is made to be soluble in alkali when the acid labile group is eliminated;

(B) an acid generator; and (C) an amine compound or amine oxide compound (except for those having a nitrogen atom of amine or amine oxide included in a ring structure of an aromatic ring) at least having a carboxyl group and having no hydrogen atoms covalently bonded to a nitrogen atom as a basic center as a basic component.

The amine compound or amine oxide compound having a carboxyl group and having no hydrogen atoms covalently bonded to a nitrogen atom as a basic center, is extremely effective as a basic substance to be added into a positive resist composition.

In this case, the nitrogen atom of (C) the amine compound or amine oxide compound having a carboxyl group and having no hydrogen atoms covalently bonded to a nitrogen atom as a basic center, preferably has three single bonds combined to different carbon atoms, respectively.

The amine compound or amine oxide compound having a carboxyl group and having no hydrogen atoms covalently bonded to a nitrogen atom as a basic center of (C), may include an amine compound or amine oxide compound having a carboxyl group represented by the following general formula (1), (2), or (3)

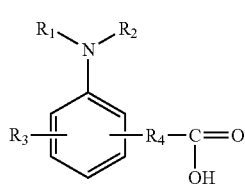
(1)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

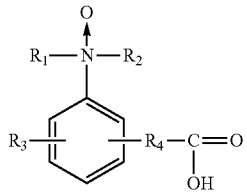
(2)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms,

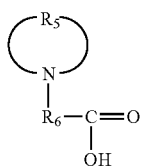
(3)

wherein $R_5$ is a linear or branched substitutable alkylene group having 2 to 20 carbon atoms, wherein the alkylene group may include, between its carbon atoms, one or more carbonyl groups, ether groups, ester groups, or sulfides; and $R_6$ is a linear, branched, or cyclic alkylene group having 1 to 20 carbon atoms, or an arylene group having 6 to 20 carbon atoms.

Addition of such an amine compound or amine oxide compound is particularly advantageous to formation of a resist pattern exhibiting an excellent profile having a less dependency on a substrate.

Furthermore, The chemically amplified positive resist composition may further comprise one or more kinds of amine compounds or amine oxide compounds each represented by the following general formula (4) or general formula (5):

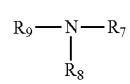
(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

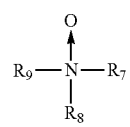
(5)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

Combination of such bases is sometimes advantageous, depending on combination of polymers, acid generators, and the like.

Moreover, the present invention provides a chemically amplified negative resist composition containing, as main components:

(A2) a base resin, which is soluble in alkali and which is made insoluble in alkali with the aid of an acid catalyst; and/or, a combination of a base resin with a crosslinking agent, which base resin is soluble in alkali and is made insoluble in alkali via reaction with the crosslinking agent with the aid of an acid catalyst;

(B) an acid generator; and (C) an amine compound or amine oxide compound (except for those having a nitrogen atom of amine or amine oxide included in a ring structure of an aromatic ring) at least having a carboxyl group and having no hydrogen atoms covalently bonded to a nitrogen atom as a basic center as a basic component.

The amine compound or amine oxide compound having a carboxyl group and having no hydrogen atoms covalently bonded to a nitrogen atom as a basic center, is also extremely effective as a basic substance to be added into a negative resist composition.

In this case, the nitrogen atom of (C) the amine compound or amine oxide compound having a carboxyl group and having no hydrogen atoms covalently bonded to a nitrogen atom as a basic center, preferably has three single bonds combined to different carbon atoms, respectively.

The amine compound or amine oxide compound having a carboxyl group and having no hydrogen atoms covalently bonded to a nitrogen atom as a basic center of (C), may include an amine compound or amine oxide compound having a carboxyl group represented by the following general formula (1), (2), or (3)

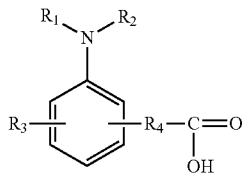

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

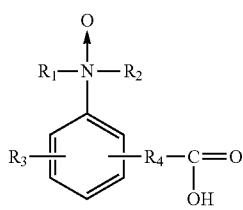

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;

$R_1$ and $R_2$ may be bonded to each other to form a ring structure;

$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and $R_4$ is a linear, branched, or cyclic alkylene group having 0 to 20 carbon atoms, or an arylene group having 6 to 20 carbon atoms.

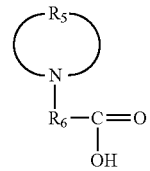

wherein $R_5$ is a linear or branched substitutable alkylene group having 2 to 20 carbon atoms, wherein the alkylene group may include, between its carbon atoms, one or more carbonyl groups, ether groups, ester groups, or sulfides; and $R_6$ is a linear, branched, or cyclic alkylene group having 1 to 20 carbon atoms, or an arylene group having 6 to 20 carbon atoms.

Addition of such an amine compound or amine oxide compound is particularly advantageous to formation of a resist pattern exhibiting an excellent profile having a less dependency on a substrate.

Furthermore, The chemically amplified negative resist composition may further comprise one or more kinds of amine compounds or amine oxide compounds each represented by the following general formula (4) or general formula (5):

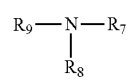

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

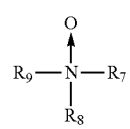

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

Combination of such bases is sometimes advantageous, depending on combination of polymers, acid generators, and the like.

Furthermore, the present invention provides a resist patterning process comprising, at least, a steps of:
coating the above described resist composition onto a processing substrate, and heating it to thereby eliminate an excessive solvent component remaining in the coated film, to obtain a resist film;
conducting pattern exposure by a high energy radiation; and
conducting, after a post-exposure baking treatment as required, development by a developer.

As a particularly useful configuration of a resist patterning process, the present invention provides a patterning process comprising, at least, a steps of:
coating the above described resist composition onto a mask blanks formed with a chromium compound film;
conducting, after a heat treatment, pattern exposure by a high energy radiation through a photomask, or pattern exposure by high energy radiation beam;
conducting, after a heat treatment as required, development by a developer.

Although it is extremely difficult to control a profile of a resist pattern near its boundary face on a chromium compound of a chromium compound film, it is possible to form a resist pattern having a desirable profile by adopting the resist patterning process of the present invention.

The present invention is configured to blend the amine compound or amine oxide compound, having a carboxyl group and having no hydrogen atoms covalently bonded to a nitrogen atom as a basic center as a basic component, into the resist composition, so that the resist composition is allowed to provide remarkably improve perpendicularity of a line pattern even at a substrate-side boundary face of resist, in addition to a higher resolution, and provide an excellent etching resistance for preserving a pattern profile. Particularly, it becomes possible to provide: a chemically amplified resist composition containing an amine compound or amine oxide compound having a carboxyl group, which resist composition is desirable as a fine pattern forming, material for production of a VLSI and a photomask; and a patterning process utilizing the resist composition.

DETAILED DESCRIPTION OF THE PREFERRED EMBODIMENTS

Although embodiments of the present invention will be explained in detail, the present invention is not limited thereto.

The present inventors have earnestly conducted investigation of an unknown compound, which is to be blended into a resist composition to thereby provide an excellent pattern profile at a substrate-side boundary face of resist, in addition to a higher resolution. As a result, there has been obtained a chemically amplified photoresist composition, which provides an excellent pattern profile even at a substrate-side boundary face of resist, in addition to a higher resolution. The present invention has been narrowly carried out in a manner that, although examples of such amine compound or amine oxide compound having a carboxyl group and having no hydrogen atoms covalently bonded to a nitrogen atom as a basic center, include compounds or oxide compounds of amines (so-called tertiary amines) having substituted three different carbon atoms, and compounds or oxide compounds of imines having substituted two different carbon atoms; it is found that the amine compounds or amine oxide compounds having a carboxyl group and having no hydrogen atoms covalently bonded to a nitrogen atom as a basic center represented by the following general formulae (1) to (3), can be readily obtained at higher yields, and exhibit higher blending effects, respectively. Particularly, at substrate-side boundary faces of resist in case of conventional resist compositions, when development has been conducted by a developer after a heat treatment as required after exposure by electron beam; fine patterns are not resolved due to footing in case of positive-typed space patterns; while undercut is made considerable in case of negative-typed line patterns such that narrowly resolved fine patterns are made substantially meaningless due to pattern collapse caused by undercut after development. Such situations can be avoided by adoption of the resist composition of the present invention, while exhibiting an extremely enhanced improving effect.

Although the nitrogen-containing compounds to be blended in the resist composition of the present invention embrace the amine compounds or amine oxide compounds at least having a carboxyl group and having no hydrogen atoms covalently bonded to a nitrogen atom as a basic center as represented by the following general formulae (1) to (3) as noted above, the present invention is not limited thereto, and it is also possible to blend, into the resist composition, typically used amine compounds having no carboxyl groups and oxidizedly obtained compounds thereof having amine oxide structures, in addition to the amine compound or amine oxide compound having a carboxyl group and having no hydrogen atoms covalently bonded to a nitrogen atom as a basic center.

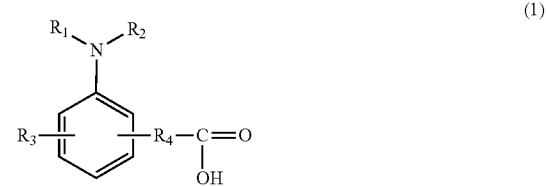

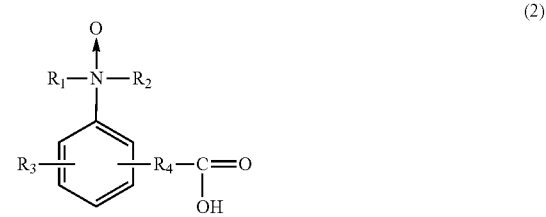

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;
$R_1$ and $R_2$ may be bonded to each other to form a ring structure;
$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group;

$R_4$ is a linear, branched, or cyclic alkylene group having 0 to 20 carbon atoms, or an arylene group having 6 to 20 carbon atoms;

$R_5$ is a linear or branched substitutable alkylene group having 2 to 20 carbon atoms, wherein the alkylene group may include, between its carbon atoms, one or more carbonyl groups, ether groups, ester groups, or sulfides; and $R_6$ is a linear, branched, or cyclic alkylene group having 1 to 20 carbon atoms, or an arylene group having 6 to 20 carbon atoms.

Without any limitations, examples of an aryl group having 6 to 20 carbon atoms concretely include a phenyl group, naphthyl group, anthryl group, phenanthryl group, pyrenyl group, naphthacenyl group, and fluorenyl group; examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of an aralkyl group having 7 to 20 carbon atoms concretely include a benzyl group, phenethyl group, phenylpropyl group, naphthylmethyl group, naphthylethyl group, and anthracenylmethyl group; examples of a hydroxyalkyl group having 2 to 10 carbon atoms concretely include a hydroxymethyl group, hydroxyethyl group, and hydroxypropyl group; examples of an alkoxyalkyl group having 2 to 10 carbon atoms concretely include a methoxymethyl group, 2-methoxyethyl group, ethoxymethyl group, 2-ethoxyethyl group, propoxymethyl group, 2-propoxyethyl group, butoxymethyl group, 2-butoxyethyl group, amyloxymethyl group, 2-amyloxyethyl group, cyclohexyloxymethyl group, 2-cyclohexyloxyethyl group, cyclopentyloxymethyl group, 2-cyclopentyloxyethyl group, and isomers of alkyl portions thereof, respectively; examples of an acyloxyalkyl group having 2 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; and examples of an alkylthio-alkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group.

Examples of the amine compounds having a carboxyl group and having no hydrogen atoms covalently bonded to a nitrogen atom as a basic center of the present invention as represented by the general formula (1) will be concretely enumerated below, without limited thereto.

Namely, such examples include: o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl)benzoic acid, and 2-(4-(dibutylamino)-2-hydroxybenzoyl)benzoic acid.

The amine oxide compound having a carboxyl group and having no hydrogen atoms covalently bonded to a nitrogen atom as a basic center of the present invention as represented by the general formula (2) is obtained by oxidizing each of the amine compounds concretely enumerated above, without limited thereto.

Further, examples of the amine compound having a carboxyl group and having no hydrogen atoms covalently bonded to a nitrogen atom as a basic center of the present invention as represented by the general formula (3) will be concretely enumerated below, without limited thereto.

Namely, examples thereof include 1-piperidinepropionic acid, 1-piperidinebutyric acid, 1-piperidinemalic acid, 1-piperidinepyruvic acid, 1-piperidinelactic acid, and the like.

The amine oxide structure represented by the general formula (2) embraces existing or novel compounds, and such compounds having an amine oxide structure are to be produced by selecting optimum techniques corresponding to the structures of the compounds, respectively. Examples thereof include a technique to adopt an oxidation reaction using an oxidizing agent for a nitrogen-containing compound, and a technique to adopt an oxidation reaction of a nitrogen-containing compound in a diluted solution of hydrogen peroxide, without limited thereto. This will be explained in detail.

Exemplarily described below is a production method of a nitrogen-containing alcohol compound by an esterification reaction, and this is also applicable to synthesis of the compound represented by the general formula (2).

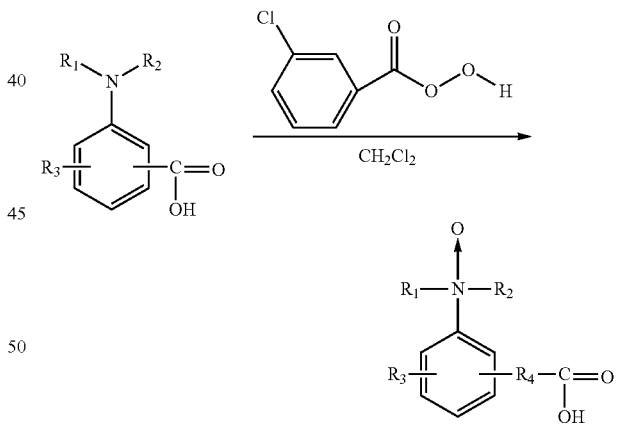

In the above formula, although this reaction is an oxidation reaction of amine adopting an oxidizing agent (m-chloroperbenzoic acid), this reaction can be conducted by another oxidizing agent in a usual manner of an oxidation reaction. After the reaction, mixed reaction products can be purified by usual manners such as distillation, chromatography, recrystallization, and the like (for details thereof, see Japanese Patent Application Laid-open (kokai) No 2008-102383).

According to the present invention, it is expected that in the amine compounds or amine oxide compounds having a carboxyl group in the molecule and having no hydrogen atoms covalently bonded to a nitrogen atom as a basic center, presence of a functional group substitutedly provided on the nitrogen atom realizes rapid capture of generated acids while the carboxyl group is located at a substrate side, so that generated acids are prevented from diffusing into a substrate and from being inactivated; and as a result thereof; it is considered that the photoresist including the added amine compound or amine oxide compound having a carboxyl group of the present invention enables achievement of a higher resolution, and a pattern profile excellent in perpendicularity at a substrate-side boundary face of resist. Further, it appears that, by selecting appropriate ones of possible structures of the amine compounds or amine oxide compounds having a carboxyl group and having no hydrogen atoms covalently bonded to a nitrogen atom as a basic center of the present invention, volatilities, basic, acid capturing rates, and diffusion velocities in resist of the amine compounds or amine oxide compounds having a carboxyl group and having no hydrogen atoms covalently bonded to a nitrogen atom as a basic center of the present invention can be appropriately adjusted correspondingly to combinations of resist polymers and acid generators to be used, thereby resultingly enabling provision of an amine compound or amine oxide additive having a carboxyl group and having no hydrogen atoms covalently bonded to a nitrogen atom as a basic center, which can optimally adjust properties such as a pattern profile of a resist composition.

Since amine compounds like primary amines having hydrogen atoms covalently bonded to a nitrogen atom as a basic center, have no effects for overcoming a problem of footing profile or undercut, it is desirable to use tertiary amines to maximally exhibit the effect, which amines each have no hydrogen atoms covalently bonded to a nitrogen atom as a basic center.

Further, although amine compounds such as 2-quinolinecarboxylic acid, nicotinic acid and the like having a nitrogen atom included in an aromatic ring have no hydrogen atoms covalently bonded to the nitrogen atom as a basic center, the compounds are weak base, so that the carboxyl group of each compound is not considered to be located at a substrate side. As such, it is impossible to prevent generated acids from being diffused into a substrate and thus inactivated.

Usable as an organic solvent in the resist composition of the present invention are any organic solvents in which the base resin(s), the acid generator, other additives, and the like are soluble. Examples of the organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely, or mixedly in two or more kinds, without limited thereto. Desirably usable in the present invention among them, are diethylene glycol dimethyl ether, 1-ethoxy-2-propanol, propylene glycol monomethyl ether acetate, and mixed solvents of them, since they are most excellent in solubility for the acid generator in the resist components.

The usage amount of the organic solvent is preferably 200 to 5,000 parts, and particularly 400 to 3,600 parts relative to 100 parts of base resin.

While the amine compound or amine oxide compound having a carboxyl group and having no hydrogen atoms covalently bonded to a nitrogen atom as a basic center of the present invention, is used in a manner blended in a resist composition as described above, the chemically amplified resist composition may be either positive or negative, and the chemically amplified positive material typically contains, in addition to the solvent, (A1) a base resin insoluble or hardly soluble in alkali, having an acidic functional group protected by an acid labile group, wherein the resin is made to be soluble in alkali when the acid labile group is eliminated;

(B) an acid generator; and (C) an amine compound or amine oxide compound having a carboxyl group and having no hydrogen atoms covalently bonded to a nitrogen atom as a basic center (where the nitrogen atom of the amine is not included in an aromatic ring structure); or a mixture of an amine compound or amine oxide compound having a carboxyl group and having no hydrogen atoms covalently bonded to a nitrogen atom as a basic center, with a basic compound containing no carboxyl groups.

Numerously known as the base polymer (base resin) as the component (A-1) used for the chemically amplified positive resist of the present invention, are:

polyhydroxystyrene (PHS), and copolymer of PHS with styrene, (meth)acrylic acid ester and another polymeric olefin compound, in case of a resist for KrF excimer laser, or a resist for electron beam (Japanese Patent Application Laid-open (kokai) No 2005-326833);

(meth)acrylic acid ester polymers, alternating copolymers of cyclo-olefin and maleic anhydride, and copolymers including vinyl ethers or (meth)acrylic acid ester (for example, Japanese Patent Application Laid-open (kokai) No 2008-111103), polynorbornene polymers, cyclo-olefin ring-opening metathesis polymers, in case of a resist for ArF excimer laser;

fluorine-substituted products of the above polymers for KrF, ArF, ring-closing polymerization based polymers using fluorinated dienes, and the like, in case of a resist for $F_2$ laser; and silicon-substituted products of the above polymers, polysilsesquioxane polymers, and the like, in case of a double-layered resist; and any one of the above polymers is usable, without limited to the polymerized polymers.

The base polymer can be used solely, or mixedly in two or more kinds. In case of a positive resist, it is typical to decrease a dissolution rate of an unexposed area, by substituting a hydroxyl group of phenol, carboxyl group, or fluorinated alkyl alcohol, with an acid labile group.

Although the acid labile groups of the base polymer can be variously selected, the acid labile groups are preferably and exemplarily acetal groups having 2 to 30 carbon atoms, tertiary alkyl groups having 4 to 30 carbon atoms, particularly represented by the following formulae (P1) and (P2), respectively:

-continued

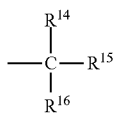
(P2)

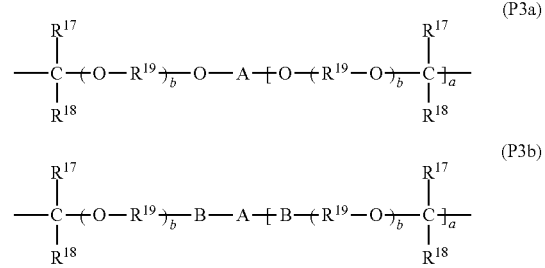
(P3a)
(P3b)

In the formulae (P1) and (P2), $R^{11}$ and $R^{12}$ are each a hydrogen atom, or a linear, branched, or cyclic alkyl group having 1 to 20 carbon atoms, particularly 1 to 12 carbon atoms, which may contain a heteroatom such as oxygen, sulfur, nitrogen, fluorine, or the like; and $R^{13}$, $R^{14}$, $R^{15}$, and $R^{16}$ are each a linear, branched, or cyclic alkyl group, aryl group, or aralkyl group having 1 to 20 carbon atoms, particularly 1 to 12 carbon atoms, which may contain a heteroatom such as oxygen, sulfur, nitrogen, fluorine, or the like. Further, $R^{11}$ and $R^{12}$, $R^{11}$ and $R^{13}$, $R^{12}$ and $R^{13}$, $R^{14}$ and $R^{15}$, $R^{14}$ and $R^{16}$, and $R^{15}$ and $R^{16}$ may be bonded to each other, to thereby form a ring having 3 to 20 carbon atoms, particularly 3 to 12 carbon atoms, together with the carbon atom and oxygen atom, if any, to which the applicable groups are bonded.

Examples of the acetal group represented by the formula (P1) concretely include: a methoxymethyl group, ethoxymethyl group, propoxymethyl group, butoxymethyl group, isopropoxymethyl group, t-butoxymethyl group, 1-methoxyethyl group, 1-methoxypropyl group, 1-methoxybutyl group, 1-ethoxyethyl group, 1-ethoxypropyl group, 1-ethoxybutyl group, 1-propoxyethyl group, 1-propoxypropyl group, 1-propoxybutyl group, 1-cyclopentyloxyethyl group, 1-cyclohexyloxyethyl group, 2-methoxyisopropyl group, 2-ethoxyisopropyl group, 1-phenoxyethyl group, 1-benzyloxyethyl group, 1-phenoxypropyl group, 1-benzyloxypropyl group, 1-adamantyloxyethyl group, 1-adamantyloxypropyl group, 2-tetrahydrofuryl group, 2-tetrahydro-2H-pyranyl group, 1-(2-cyclohexanecarbonyloxyethoxy)ethyl group, 1-(2-cyclohexanecarbonyloxyethoxy)propyl group, 1-[2-(1-adamantylcarbonyloxy)ethoxy]ethyl group, and 1-[2-(1-adamantylcarbonyloxy)ethoxy]propyl group, without limited thereto.

Examples of the tertiary alkyl group represented by the formula (P2) concretely include: t-butyl group, t-pentyl group, 1-ethyl-1-methylpropyl group, 1,1-diethylpropyl group, 1,1,2-trimethylpropyl group, 1-adamantyl-1-methyl-ethyl group, 1-methyl-1-(2-norbornyl)ethyl group, 1-methyl-1-(tetrahydrofuran-2-yl)ethyl group, 1-methyl-1-(7-oxanorbornane-2-yl)ethyl group, 1-methylcyclopentyl group, 1-ethylcyclopentyl group, 1-propylcyclopentyl group, 1-cyclopentylcyclopentyl group, 1-cyclohexylcyclopentyl group, 1-(2-tetrahydrofuryl)cyclopentyl group, 1-(7-oxanorbornane-2-yl)cyclopentyl group, 1-methylcyclohexyl group, 1-ethylcyclohexyl group, 1-cyclopentylcyclohexyl group, 1-cyclohexylcyclohexyl group, 2-methyl-2-norbornyl group, 2-ethyl-2-norbornyl group, 8-methyl-8-tricyclo[5.2.1.0$^{2,6}$]decyl group, 8-ethyl-8-tricyclo[5.2.1.0$^{2,6}$]decyl group, 3-methyl-3-tetracyclo[4.4.0.1$^{2,5}$,1$^{7,10}$]dodecyl group, 3-ethyl-3-tetracyclo[4.4.0.1$^{2,5}$,1$^{7,10}$]dodecyl group, 2-methyl-2-adamantyl group, 2-ethyl-2-adamantyl group, 1-methyl-3-oxo-1-cyclohexyl group, 1-methyl-1-(tetrahydrofuran-2-yl) ethyl group, 5-hydroxy-2-methyl-2-adamantyl group, and 5-hydroxy-2-ethyl-2-adamantyl group, without limited thereto.

Further, part of the hydroxyl group of the base resin may be cross-linked in an intermolecular or intramolecular manner, by an acid labile group represented by the general formula (P3a) or (P3b):

wherein $R^{17}$ and $R^{18}$ each represent a hydrogen atom, or a linear, branched, or cyclic alkyl group having 1 to 8 carbon atoms;

$R^{17}$ and $R^{18}$ may be bonded to each other to form a ring together with a carbon atom to which they are bonded; and in case of formation of the ring, $R^{17}$ and $R^{18}$ each represent a linear or branched alkylene group having 1 to 8 carbon atoms;

$R^{19}$ is a linear, branched, or cyclic alkylene group having 1 to 10 carbon atoms, and b is 0 or an integer of 1 to 10;

A represents a chain or alicyclic saturated hydrocarbon group, aromatic hydrocarbon group, or heterocycle group having a valence of a+1 and having 1 to 50 carbon atoms, and the group may have an interposed heteroatom or may have some of hydrogen atoms each substituted by a hydroxyl group, carboxyl group, carbonyl group, or fluorine atom;

B represents —CO—O—, —NHCO—O—, or —NH-CONH—; and a is an integer of 1 to 7.

Examples of the cross-linked acetal represented by the general formula (P3a) or (P3b) concretely include those represented by the following formulae (P3)-1 to (P3)-8, without limited thereto:

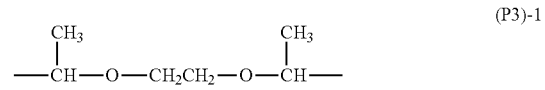
(P3)-1

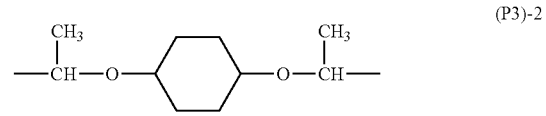
(P3)-2

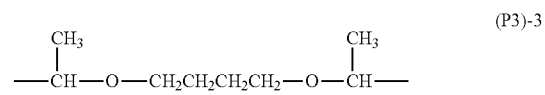
(P3)-3

(P3)-4

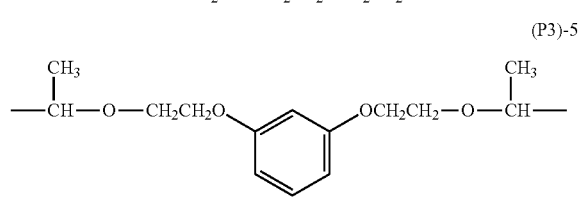
(P3)-5

-continued

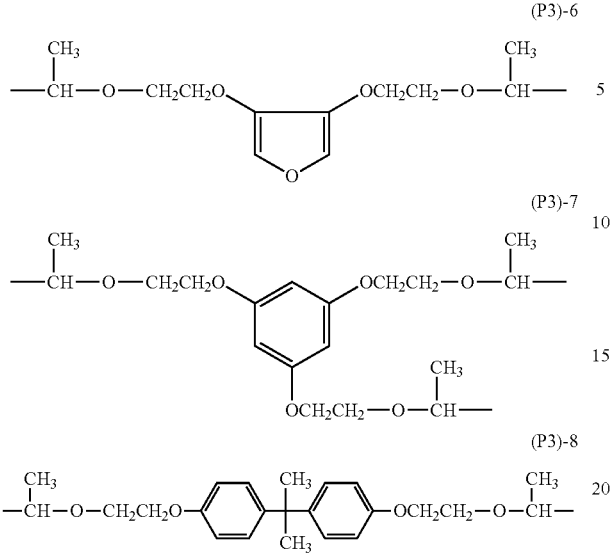

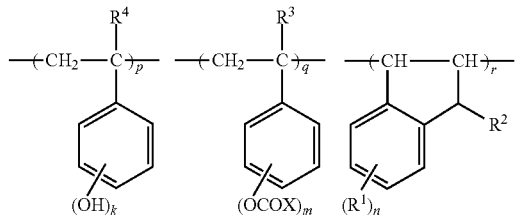

The base polymer preferably has a weight-average molecular weight of 2,000 to 100,000 as determined relative to polystyrene standards by gel permeation chromatography (GPC), and weight-average molecular weights less than 2,000 may lead to deteriorated film-forming ability and deteriorated resolution, while weight-average molecular weights exceeding 100,000 may lead to deteriorated resolution or lead to occurrence of extraneous substance upon formation of pattern.

Examples of the base polymer as the component (A-2) used for the chemically amplified negative resist of the present invention, include:
- polyhydroxystyrene (PHS), and copolymer of PHS with styrene, (meth)acrylic acid ester and another polymeric olefin compound, in case of a resist for KrF excimer laser, or a resist for electron beam;
- (meth)acrylic acid ester polymers, alternating copolymers of cyclo-olefin and maleic anhydride, and copolymers including vinyl ethers or (meth)acrylic acid ester, polynorbornene polymers, cyclo-olefin ring-opening metathesis polymers, in case of a resist for ArF excimer laser;
- fluorine-substituted products of the above polymers for KrF, ArF, ring-closing polymerization based polymers using fluorinated dienes, and the like, in case of a resist for $F_2$ laser; and
- silicon-substituted products of the above polymers, polysilsesquioxane polymers, and the like, in case of a double-layered resist;
- without limited to the polymerized polymers.

The base polymer can be used solely, or mixedly in two or more kinds. In case of a negative resist, it is typical:
- to obtain a solubility in alkali, by adopting a hydroxyl group of phenol, carboxyl group, or fluorinated alkyl alcohol; and
- to decrease a dissolution rate of an exposed portion, by achieving polymer cross-linking upon generation of acids, by means of a unit having a substitutional group such as epoxy group or acetal group capable of forming a bond to another unit in an electrophilic manner within the polymer, or by means of a crosslinking agent.

Desirably usable examples (see Japanese Patent Application Laid-open (kokai) No 2006-201532) of the base polymer to be used for KrF excimer laser or electron beam are represented as follows:

In case of these examples, solubility in alkali is obtained by acidity of phenolic hydroxyl group(s), and for example, adoption of a glycidyl group as X allows for provision of a cross-linking reactivity between polymers in the presence of acid catalyst. Further, the unit for providing a cross-linking reactivity may be provided by copolymerizing what is possessed by an ester group of acrylic ester. Moreover, in case of using an alkali-soluble base resin in combination with a crosslinking agent, it is unnecessary to make the base polymer to have an electrophilic reactivity.

Usable as a crosslinking agent to be blended in the chemically amplified negative resist are any ones insofar as configured to attain intramolecular and intermolecular cross-linking of the alkali-soluble base polymer, based on acids generated by a photoacid generator. Examples of preferable crosslinking agents include alkoxymethylglycolurils, and alkoxymethyl melamines.

Examples of desirable alkoxymethyl melamines include hexamethoxymethyl melamine and hexaethoxymethyl melamine.

Included as the component (B) of the chemically amplified resist composition of the present invention, is an acid generator, i.e., a so-called photoacid generator, as a neutral substance configured to be decomposed by high energy radiation to thereby turn into an acidic substance. Those are called photoacid generators, respectively, herein which generate acids by general high energy radiations without limited to light, and this is to distinguish them from a thermal acid generator to be used for thermosetting resins and the like. Usable as components of photoacid generators are basically any compounds insofar as configured to generate acids by irradiation of high energy radiation. Examples of typically used photoacid generators include sulfonium salts, iodonium salts, sulfonyldiazomethanes, N-sulfonyloxydicarboxyImides, O-arylsulfonyloximes, and O-alkylsulfonyloximes. Although preferable ones are detailedly explained below, they may be used solely or mixedly in two or more kinds.

Sulfonium salts are salts of sulfonium cations with sulfonates, bis(substituted alkylsulfonyl)imides, or tris(substituted alkylsulfonyl)methides;
examples of sulfonium cations include: triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl) diphenylsulfonium, bis(3-tert-butoxyphenyl) phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium;

examples of sultanates include: trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, oetanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfanate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate;

examples of bis(substituted alkylsulfonyl)imides include: bis(trifluoromethylsulfonyl)imide, bis(pentafluoroethylsulfonyl)imide, bis(heptafluoropropylsulfonyl)imide, and perfluoro(1,3-propylenebissulfonyl)imide;

examples of tris(substituted alkylsulfonyl)methide include tris(trifluoromethylsulfonyl)methide; and examples of sulfonium salts include combinations of the above.

Iodonium salts are salts of iodonium cations with sulfonates, bis(substituted alkylsulfonyl)imides, or tris(substituted alkylsulfonyl)methides;

examples of iodonium cations include: aryliodonium cations including diphenyliodinium, bis(4-tert-butylphenyl)iodonium, 4-tort-butoxyphenylphenyliodonium, and 4-methoxyphenylphenyliodonium;

examples of sulfonates include: trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate;

examples of bis(substituted alkylsulfonyl)imides include: bis(trifluoromethylsulfonyl)imide, bis(pentafluoroethylsulfonyl)imide, bis(heptafluoropropylsulfonyl)imide, and perfluoro(1,3-propylenebissulfonyl)imide;

examples of tris(substituted alkylsulfonyl)methide include tris(trifluoromethylsulfonyl)methide; and examples of iodonium salts include combinations of the above.

Examples of sulfonyldiazomethanes include bissulfonyldiazomethanes and sulfonyl-carbonyldiazomethanes such as: bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)

diazomethane, bis(4-methanesulfonyloxyphenylsulfonyl)diazomethane, bis(4-(p-toluenesulfonyloxy)phenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxyphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Examples of N-sulfonyloxydicarboxylmide type photoacid generators include compounds, which are combinations of imide structures such as: succinimide, naphthalenedicarboximide, phthalimide, cyclohexyldicarboximide, 5-norbornene-2,3-dicarboximide, and 7-oxabicyclo[2.2.1]-5-heptene-2,3-dicarboximide;

with: trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Examples of O-arylsulfonyloxime compounds or O-alkylsulfonyloxime compound (oxime sulfonate) type photoacid generators include: glyoxime derivative types; oxime sulfonate types each with a long conjugated system including intervening thiophene or cyclohexadiene; oxime sulfonate types having an electron withdrawing group such as trifluoromethyl group for increasing a stability of the compound; oxime sulfonate types using phenylacetonitrile or substituted acetonitrile derivatives; and bisoxime sulfonate types.

Examples of glyoxime derivative type photoacid generators include: bis-β-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-β-(trifluoromethanesulfonyl)-nioxime, bis-O-(2,2,2-trifluoroethanesulfonyl)-nioxime, bis-β-(10-camphorsulfonyl)-nioxime, bis-O-(benzenesulfonyl)-nioxime, bis-O-(4-fluorobenzenesulfonyl)-nioxime, bis-O-(4-trifluoromethylbenzenesulfonyl)-nioxime, and bis-O-(xylenesulfonyl)-nioxime; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Examples of oxime sulfonate type photoacid generators each with a long conjugated system including intervening thiophene or cyclohexadiene, include:

(5-(p-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(p-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, (5-(4-(p-toluenesulfonyloxy)benzenesulfonyl)oxyimino-5H-thiophen-2-ylidene)phenylacetonitrile, and (5-(2,5-bis(p- toluenesulfonyloxy)benzenesulfonyl)oxyimino-5H-thiophen-2-ylidene)phenylacetonitrile; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Examples of oxime sulfonate type photoacid generators having an electron withdrawing group such as trifluoromethyl group for increasing a stability of the compound, include:

2,2,2-trifluoro-1-phenyl-ethanone=O-(methylsulfonyl)oxime, 2,2,2-trifluoro-1-phenyl-ethanone=O-(10-camphorsulfonyl)oxime, 2,2,2-trifluoro-1-phenylethanone=O-(4-methoxybenzenesulfonyl)oxime, 2,2,2-trifluoro-1-phenylethanone=O-(1-naphthylsulfonyl)oxime, 2,2,2-trifluoro-1-phenylethanone=O-(2-naphthylsulfonyl)oxime, 2,2,2-trifluoro-1-phenylethanone=O-(2,4,6-trimethylphenylsulfonyl)oxime, 2,2,2-trifluoro-1-(4-methylphenyl)ethanone=O-(10-camphorsulfonyl)oxime, 2,2,2-trifluoro-1-(4-methylphenyl)ethanone=O-(methylsulfonyl)oxime, 2,2,2-trifluoro-1-(2-methylphenyl)ethanone=O-(10-camphorsulfonyl)oxime, 2,2,2-trifluoro-1-(2,4-dimethylphenyl)ethanone=O-(10-camphorsulfonyl)oxime, 2,2,2-trifluoro-1-(2,4-dimethylphenyl)ethanone=O-(1-naphthylsulfonyl)oxime, 2,2,2-trifluoro-1-(2,4-dimethylphenyl)-ethanone=O-(2-naphthylsulfonyl)oxime, 2,2,2-trifluoro-1-(2,4,6-trimethylphenyl)ethanone=O-(10-camphorsulfonyl)oxime, 2,2,2-trifluoro-1-(2,4,6-trimethylphenyl)ethanone=O-(1-naphthylsulfonyl)oxime, 2,2,2-trifluoro-1-(2,4,6-trimethylphenyl)ethanone=O-(2-naphthylsulfonyl)oxime, 2,2,2-trifluoro-1-(4-methoxyphenyl)ethanone=O-(methylsulfonyl)oxime, 2,2,2-trifluoro-1-(4-methylthiophenyl)-ethanone=O-(methylsulfonyl)oxime, 2,2,2-trifluoro-1-(3,4-dimethoxyphenyl)ethanone=O-(methylsulfonyl)oxime, 2,2,2-trifluoro-1-(4-methoxyphenyl)ethanone=O-(4-methylphenylsulfonyl)oxime, 2,2,2-trifluoro-1-(4-methoxyphenyl)ethanone=O-(4-methoxyphenylsulfonyl)oxime, 2,2,2-trifluoro-1-(4-methoxyphenyl)ethanone=O-(4-dodecylphenylsulfonyl)oxime, 2,2,2-trifluoro-1-(4-methoxyphenyl)ethanone=O-(octylsulfonyl)oxime, 2,2,2-trifluoro-1-(4-thiomethylphenyl)ethanone=O-(4-methoxyphenylsulfonyl)oxime, 2,2,2-trifluoro-1-(4-thiomethylphenyl)ethanone=O-(4-dodecylphenylsulfonyl)oxime, 2,2,2-trifluoro-1-(4-thiomethylphenyl)ethanone-=O-(octylsulfonyl)oxime, 2,2,2-trifluoro-1-(4-thiomethylphenyl)ethanone=O-(2-naphthylsulfonyl)oxime, 2,2,2-trifluoro-1-(2-methylphenyl)ethanone=O-(methylsulfonyl)oxime, 2,2,2-trifluoro-1-(4-methylphenyl)ethanone=O-(phenylsulfonyl)oxime, 2,2,2-trifluoro-1-(4-chlorophenyl)ethanone=O-(phenylsulfonyl)oxime, 2,2,3,3,4,4,4-heptafluoro-1-phenylbutanone=O-(10-camphorsulfonyl)oxime, 2,2,2-trifluoro-1-(1-naphthyl)ethanone=O-(methylsulfonyl)oxime, 2,2,2-trifluoro-1-(2-naphthyl)ethanone=O-(methylsulfonyl)oxime, 2,2,2-trifluoro-1-(4-benzylphenyl)ethanone=O-(methylsulfonyl)oxime, 2,2,2-trifluoro-1-(4-(phenyl-1,4-dioxa-but-1-yl)phenyl)ethanone=O-(methylsulfonyl)oxime, 2,2,2-trifluoro-1-(1-naphthyl)ethanone=O-(propylsulfonyl)oxime, 2,2,2-trifluoro-1-(2-naphthyl)ethanone=O-(propylsulfonyl)oxime, 2,2,2-trifluoro-1-(4-benzylphenyl)ethanone=O-(propylsulfonyl)oxime, 2,2,2-trifluoro-1-(4-methylsulfonylphenyl)ethanone=O-(propylsulfonyl)oxime, 2,2,2-trifluoro-1-(4-methylsulfonyloxyphenyl)ethanone=O-(propylsulfonyl)oxime, 2,2,2-trifluoro-1-(4-methylcarbonyloxyphenyl)ethanone=O-(propylsulfonyl)oxime, 2,2,2-trifluoro-1-(6H,7H-5,8-dioxonaphth-2-yl)ethanone=O-(propylsulfonyl)oxime, 2,2,2-trifluoro-1-(4-methoxycarbonylmethoxyphenyl)ethanone=O-(propylsulfonyl)oxime, 2,2,2-trifluoro-1-(4-methoxycarbonyl)-(4-amino-1-oxapent-1-yl)phenyl)ethanone=O-(propylsulfonyl)oxime, 2,2,2-trifluoro-1-(3,5-dimethyl-4-ethoxyphenyl)ethanone=O-(propylsulfonyl)oxime, 2,2,2-trifluoro-1-(4-benzyloxyphenyl)ethanone=O-(propylsulfonyl)oxime, 2,2,2-trifluoro-1-(2-thiophenyl)ethanone=O-(propyl sulfonate)oxime, 2,2,2-trifluoro-1-(1-dioxathiophen-2-yl)ethanone=O-(propylsulfonate)oxime; 2,2,2-trifluoro-1-(4-(3-(4-(2,2,2-trifluoro-1-(trifluoromethanesulfonyloxyimino)ethyl)phenoxy)propoxy)phenyl)ethanone=O-(trifluoromethanesulfonyl)oxime, 2,2,2-trifluoro-1-(4-(3-(4-(2,2,2-trifluoro-1-(1-propanesulfonyloxyimino)ethyl)phenoxy)propoxy)phenyl)ethanone=O-(propylsulfonyl)oxime, 2,2,2-trifluoro-1-(4-(3-(4-(2,2,2-trifluoro-1-(1-butanesulfonyloxyimino)ethyl)phenoxy)propoxy)phenyl)ethanone=O-(butylsulfonyl)oxime, 2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone=O-(4-(4-methylphenylsulfonyloxy)phenylsulfonyl)oxime, and 2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone=O-(2,5-bis(4-methylphenylsulfonyloxy)benzenesulfonyloxy)phenylsulfonyl)oxime; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Examples of the photoacid generators noted just above further include oxime sulfonates represented by the following formula (Ox-1):

wherein $R^{401}$ represents a substituted or unsubstituted haloalkylsulfonyl group or halobenzenesulfonyl group having 1 to 10 carbon atoms;

$R^{402}$ represents a haloalkyl group having 1 to 11 carbon atoms; and $Ar^{401}$ represents a substituted or unsubstituted aromatic group or heteroaromatic group.

Examples of the photoacid generators concretely include:

2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(nonafluorobutylsulfonyloxyimino)pentyl)-4-biphenyl, 2-(2,2,3,3,4,4-pentafluoro-1-(nonafluorobutylsulfonyloxyimino)butyl)-4-biphenyl, and 2-(2,2,3,3,4,4,5,5,6,6-decafluoro-1-(nonafluorobutylsulfonyloxyimino)hexyl)-4-biphenyl; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Examples of the oxime sulfonate types using phenylacetonitrile or substituted acetonitrile derivatives, include:

α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Further, examples of the bisoxime sulfonate types include:
bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, and bis(α-(4-methoxybenzenesulfonyloxy)imino)-m-phenylenediacetonitrile; and compounds of the above structures substituted by: 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Among the above photoacid generators, examples to be obtained with desirable sensitivity and stability, include sulfonium salts, bissulfonyl-diazomethanes, N-sulfonyloxyimides, and oxime-O-sulfonates.

Among the above, more preferable examples of sulfonium salts include:
triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyloxy)benzenesulfonate, 4-tert-butylphenyldiphenylsulfonium camphorsulfonate, 4-tert-butylphenyldiphenylsulfonium 2,4,6-triisopropylbenzenesulfonate, tris(4-methylphenyl)sulfonium camphorsulfonate, tris(4-tert-butylphenyl)sulfonium camphorsulfonate, 10-phenylphenoxathiinium 2,4,6-triisopropylbenzenesulfonate, triphenylsulfonium trifluoromethanesulfonate, triphenylsulfonium pentafluoroethanesulfonate, triphenylsulfonium heptafluoropropanesulfonate, triphenylsulfonium nonafluorobutanesulfonate, triphenylsulfonium tridecafluorohexanesulfonate, triphenylsulfonium heptadecafluorooctanesulfonate, triphenylsulfonium perfluoro(4-ethylcyclohexane)sulfonate, 4-methylphenyldiphenylsulfonium nonafluorobutanesulfonate, 2-oxo-2-phenylethylthiacyclopentanium nonafluorobutanesulfonate, 4-tert-butylphenyldiphenylsulfonium nonafluorobutanesulfonate, 4-tert-butylphenyldiphenylsulfonium perfluoro(4-ethylcyclohexane)sulfonate, 4-tert-butylphenyldiphenylsulfonium heptafluorooctanesulfonate, triphenylsulfonium 1,1-difluoro-2-naphthylethanesulfonate, triphenylsulfonium 1,1,2,2-tetrafluoro-2-(norbornan-2-yl)ethanesulfonate, triphenylsulfonium 2-benzoyloxy-1,1,3,3,3-pentafluoropropanesulfonate, triphenylsulfonium 1,1,3,3,3-pentafluoro-2-(pivaloyloxy)propanesulfonate, triphenylsulfonium 2-(cyclohexanecarbonyloxy)-1,1,3,3,3-pentafluoropropanesulfonate, triphenylsulfonium 2-(2-naphthoyloxy)-1,1,3,3,3-pentafluoropropanesulfonate, triphenylsulfonium 2-(1-adamantanecarbonyloxy)-1,1,3,3,3-pentafluoropropanesulfonate, triphenylsulfonium 2-hydroxy-1,1,3,3,3-pentafluoropropanesulfonate, triphenylsulfonium adamantanemethoxycarbonyldifluoromethanesulfonate, triphenylsulfonium 1-(3-hydroxymethyladamantane)methoxycarbonyldifluoromethanesulfonate, triphenylsulfonium methoxycarbonyldifluoromethanesulfonate, 4-tert-butylphenyldiphenylsulfonium 2-benzoyloxy-1,1,3,3,3-pentafluoropropanesulfonate, 4-tert-butylphenyldiphenylsulfonium 1,1,3,3,3-pentafluoro-2-(pivaloyloxy)propanesulfonate, 4-tert-butylphenyldiphenylsulfonium 2-(cyclohexanecarbonyloxy)-1,1,3,3,3-pentafluoropropanesulfonate, 4-tert-butylphenyldiphenylsulfonium 2-(2-naphthoyloxy)-1,1,3,3,3-pentafluoropropanesulfonate, 4-tert-butylphenyldiphenylsulfonium 2-(1-adamantanecarbonyloxy)-1,1,3,3,3-pentafluoropropanesulfonate, 4-tert-butylphenyldiphenylsulfonium 2-hydroxy-1,1,3,3,3-pentafluoropropanesulfonate, 4-tert-butylphenyldiphenylsulfonium adamantanemethoxycarbonyldifluoromethanesulfonate, 4-tert-butylphenyldiphenylsulfonium 1-(3-hydroxymethyladamantane)methoxycarbonyldifluoromethanesulfonate, and 4-tert-butylphenyldiphenylsulfonium methoxycarbonyldifluoromethanesulfonate.

Examples of bissulfonyl-diazomethanes include:
bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyldiazomethane, and bis(4-tert-butylphenylsulfonyl)diazomethane.

Further, examples of N-sulfonyloxyimides include:
N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophen-2-ylidene)(2-methylphenyl)acetonitrile, and (5-(p-toluenesulfonyl)oxyimino-5H-thiophen-2-ylidene)(2-methylphenyl)acetonitrile.

Furthermore, examples of oxime-O-sulfonates include:
2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino) butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

Although the addition amount of the photoacid generator in the chemically amplified resist composition of the present invention is not particularly limited, the adding amount is to be 0.4 to 20 weight parts, preferably 0.8 to 15 weight parts relative to 100 weight parts of the base resin (i.e., the component (A)) in the resist composition. Although simultaneous increase of the photoacid generator addition amount and the basic substance addition amount allows assurance of sensitivity and decrease of line edge roughness to be expected, adding amounts of the photoacid generator exceeding 20 weight parts typically lead to deteriorated sensitivity-improving effects and thus may be uneconomical. Further, adding amounts less than 0.4 weight parts necessitate to decrease the basic substance amount in order to meet the required sensitivity, thereby possibly increasing roughness of a formed resist pattern. Particularly, when the resist composition is used to form a resist film for irradiation of radiation or irradiation of electron beam thereto, addition of a photoacid generator is not problematic in energy attenuation of irradiated radiation within a film though higher sensitivity is scarcely obtained then, so that the addition amount of the photoacid generator is made to be a higher concentration such as preferably about 2.0 to 20 weight parts, as compared to a situation of adoption of excimer laser light.

Although the amine compound or amine oxide compound having a carboxyl group and having no hydrogen atoms covalently bonded to a nitrogen atom as a basic center as the basic component, which is the component (C) to be blended in the chemically amplified resist composition of the present invention, may be used solely or combinedly with each other, it is also possible to use them combinedly with other basic compounds such as having no carboxyl groups, in view of the above mechanism assumed by the present inventors.

Examples of basic compounds having no carboxyl groups upon mixed usage, include any known nitrogen-containing organic compounds having been conventionally used in resist compositions, particularly in chemically amplified resist compositions, and concretely include: primary, secondary, and tertiary aliphatic amines, mixed amines, aromatic amines, heterocyclic amines, nitrogen-containing compounds having sulfonyl group, nitrogen-containing compounds having hydroxyl group, nitrogen-containing compounds having hydroxyphenyl group, alcoholic nitrogen-containing compounds, amides, imides, and carbamates.

Concretely, examples of primary aliphatic amines include: ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine; examples of secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl methylenediamine, N,N-dimethyl ethylenediamine, and N,N-dimethyl tetraethylenepentamine; and examples of tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethyl methylenediamine, N,N,N',N'-tetramethyl ethylenediamine, and N,N,N',N'-tetramethyl tetraethylenepentamine.

Examples of mixed amines include dimethylethylamine, methylethylpropylamine, benzylamine, phenethylamine, and benzyldimethylamine. Examples of aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of nitrogen-containing compounds having sulfonyl group include 3-pyridinesulfonic acid, pyridinium p-toluenesulfonate;
  examples of nitrogen-containing compounds having hydroxyl group, nitrogen-containing compounds having hydroxyphenyl group, and alcoholic nitrogen-containing compounds include: 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, tri-isopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of amides include formamide, N-methylformamide, N,N-dimethylformamide, acetamide, N-methylacetamide, N,N-dimethylacetamide, propionamide, benzamide, and 1-cyclohexylpyrrolidone. Examples of imides include phthalimide, succinimide, and maleimide. Examples of carbamates include N-tert-butoxycarbonyl-N,N-dicyclohexylamine, N-tert-butoxycarbonylbenzimidazole, and oxazolidinone.

Further exemplified are the following nitrogen-containing organic compounds represented by the following general formula (3)-1:

$$N(X')_n(Y)_{3-n} \quad (3)\text{-}1$$

wherein, n=1, 2, or 3;
the side-chains X' may be the same or different, and can be represented by the following general formulae (X'1) to (X'3):

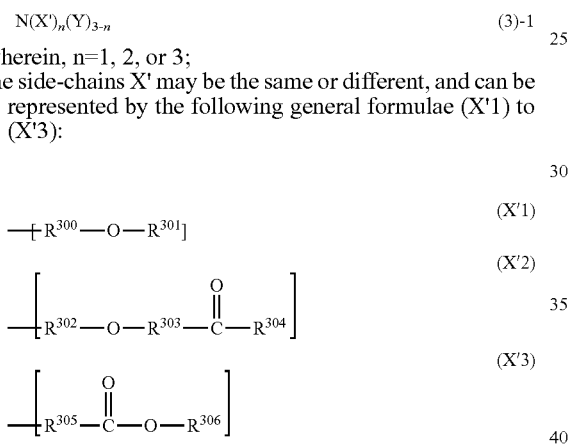

wherein, the side-chain(s), Y represents a hydrogen atom, or the same or different linear, branched, or cyclic alkyl groups having 1 to 20 carbon atoms, and may include an ether group or hydroxyl group. Further, X's may be bonded to each other to form a ring. Here, $R^{300}$, $R^{302}$, and $R^{305}$ are each a linear or branched alkylene group having 1 to 4 carbon atoms; and $R^{301}$ and $R^{304}$ are each a hydrogen atom, or a linear, branched, or cyclic alkyl group having 1 to 20 carbon atoms, and may include one or more of hydroxyl group, ether group, ester group, and lactone ring. $R^{303}$ is a single bond, or a linear or branched alkylene group having 1 to 4 carbon atoms; and $R^{306}$ is a linear, branched, or cyclic alkyl group having 1 to 20 carbon atoms, and may include one or more of hydroxyl group, ether group, ester group, and lactone ring.

Concrete examples of the compound represented by the general formula (B)-1 include:
tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris{2-(1-ethoxyethoxy)ethyl}amine, tris {2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazacyclooctadecane, 1-aza-12-crown-4,1-aza-15-crown-5,1-aza-18-crown-6, tris(2-formyloxyethyl) amine, tris(2-acetoxyethyl)amine, tris(2-propionyloxyethyl)amine, tris(2-butyryloxyethyl) amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl) ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)-bis[2-(methoxycarbonyl)ethyl] amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl) amine, N-hexyl-bis(methoxycarbonylmethyl)amine, and p-(diethylamino)-δ-valerolactone.

Further exemplified are the following nitrogen-containing organic compounds having a ring structure represented by the following general formula (B)-2:

wherein, X' is described above; and $R^{307}$ is a linear or branched alkylene group having 2 to 20 carbon atoms, and may include one or more of carbonyl group, ether group, ester group, and sulfide.

Examples of compounds represented by the general formula (B)-2 include: 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Further exemplified are the following nitrogen-containing organic compounds each containing cyano group(s) represented by the following general formulae (B)-3 through (B)-6:

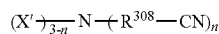
(B)-3

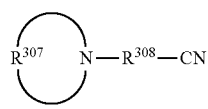
(B)-4

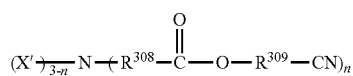
(B)-5

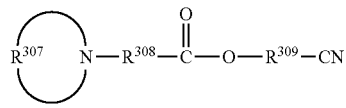
(B)-6 wherein, X', $R^{307}$, and n are described above; and $R^{308}$ and $R^{309}$ are the same or different linear or branched alkylene groups having 1 to 4 carbon atoms.

Concrete examples of the nitrogen containing organic compounds represented by the general formula (B)-3 through (B)-6 including a cyano group include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidine propionate, cyanomethyl 1-piperidine propionate, cyanomethyl 4-morpholine propionate, 2-cyanoethyl 1-pyrrolidine propionate, 2-cyanoethyl 1-piperidine propionate, and 2-cyanoethyl 4-morpholine propionate.

Further exemplified are nitrogen-containing organic compounds having an imidazole structure and a polar functional group, represented by the following general formula (8)-7:

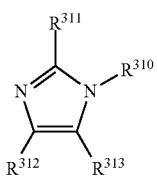
(B)-7 wherein $R^{310}$ is a linear, branched, or cyclic alkyl group having 2 to 20 carbon atoms and having one or more polar functional groups, which is each a hydroxyl group, carbonyl group, ester group, ether group, sulfide group, carbonate group, cyano group, or acetal group; and $R^{311}$, $R^{312}$, and $R^{313}$ are each a hydrogen atom, or a linear, branched, or cyclic alkyl group, aryl group, or aralkyl group having 1 to 10 carbon atoms.

Further exemplified are nitrogen-containing organic compounds having a benzimidazole structure and a polar functional group, as represented by the following general formula (3)-8:

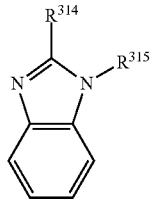

(B)-8 wherein $R^{314}$ is a hydrogen atom, or a linear, branched, or cyclic alkyl group, aryl group, or aralkyl group having 1 to 10 carbon atoms; and $R^{315}$ is a linear, branched, or cyclic alkyl group having 1 to 20 carbon atoms and having one or more polar functional groups, which is each an ester group, acetal group, or cyano group, wherein the alkyl group may additionally include one or more hydroxyl groups, carbonyl groups, ether groups, sulfide groups, or carbonate groups.

Further exemplified are nitrogen-containing heterocyclic compounds having a polar functional group(s), as represented by the following general formulae (B)-9 and (B)-10:

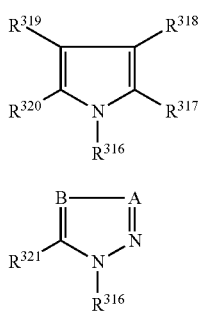

(B)-9

(B)-10 wherein A is a nitrogen atom, or =C—$R^{322}$;
B is a nitrogen atom, or =C—$R^{323}$;
$R^{316}$ is a linear, branched, or cyclic alkyl group having 2 to 20 carbon atoms and having one or more polar functional groups, which is each a hydroxyl group, carbonyl group, ester group, ether group, sulfide group, carbonate group, cyano group, or acetal group;
$R^{317}$, $R^{318}$, $R^{319}$, and $R^{320}$ are each a hydrogen atom, or a linear, branched, or cyclic alkyl group or aryl group having 1 to 10 carbon atoms; or $R^{317}$ and $R^{318}$, $R^{319}$ and $R^{320}$ may be bonded to each other to form a benzene ring, naphthalene ring, or pyridine ring;
$R^{321}$ is a hydrogen atom, or a linear, branched, or cyclic alkyl group or aryl group having 1 to 10 carbon atoms;
$R^{322}$ and $R^{323}$ are each a hydrogen atom, or a linear, branched, or cyclic alkyl group or aryl group having 1 to 10 carbon atoms; and
$R^{321}$ and $R^{323}$ may be bonded to each other to form a benzene ring or naphthalene ring;
wherein the symbol "=" does not represent a triple bond, and simply represents three bonding orbitals, which are those bonds to adjoining N and B here.

Further exemplified are nitrogen-containing organic compounds having an aromatic carboxylic acid ester structure, as represented by the following general formulae (B)-11 through (B)-14:

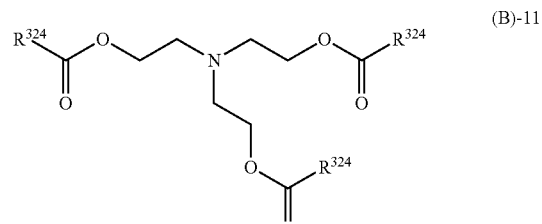

(B)-11

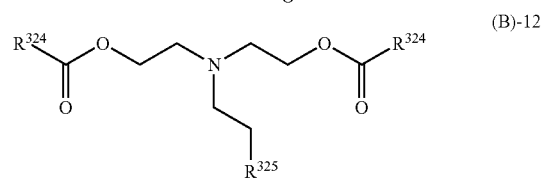

(B)-12

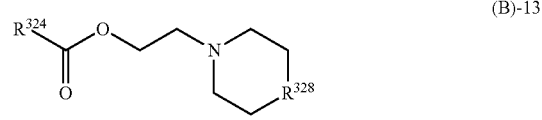

(B)-13

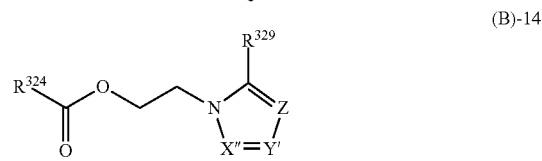

(B)-14 wherein $R^{324}$ is an aryl group having 6 to 20 carbon atoms or a heteroaromatic group having 4 to 20 carbon atoms, wherein one, some, or all of hydrogen atoms of the group may be each substituted by a halogen atom, a linear, branched, or cyclic alkyl group having 1 to 20 carbon atoms, an aryl group having 6 to 20 carbon atoms, an aralkyl group having 7 to 20 carbon atoms, an alkoxy group having 1 to 10 carbon atoms, an acyloxy group having 1 to 10 carbon atoms, or an alkylthio group having 1 to 10 carbon atoms;
$R^{325}$ is $CO_2R^{326}$, $OR^{327}$, or a cyano group;
$R^{326}$ is an alkyl group having 1 to 10 carbon atoms, wherein one or some of methylene groups thereof may be each substituted by an oxygen atom;
$R^{327}$ is an alkyl group or acyl group having 1 to 10 carbon atoms, wherein one or some of methylene groups thereof may be each substituted by an oxygen atom;
$R^{328}$ is a single bond, methylene group, ethylene group, sulfur atom, or —$O(CH_2CH_2O)_n$— group, where n=0, 1, 2, 3, or 4;
$R^{329}$ is a hydrogen atom, methyl group, ethyl group, or phenyl group;
X" is a nitrogen atom or $CR^{330}$;
Y' is a nitrogen atom or $CR^{331}$;
Z is a nitrogen atom or $CR^{332}$;
$R^{330}$, $R^{331}$, and $R^{332}$ are each independently a hydrogen atom, methyl group, or phenyl group, or
$R^{330}$ and $R^{331}$, or $R^{331}$ and $R^{332}$ may be bonded to each other to form an aromatic ring having 6 to 20 carbon atoms or a heteroaromatic ring having 2 to 20 carbon atoms.

Further exemplified are nitrogen-containing organic compounds having a 7-oxanorbornane-2-carboxylic acid ester structure, as represented by the following general formula (B)-15:

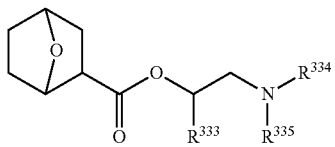

(B)-15 wherein $R^{333}$ is a hydrogen atom, or a linear, branched, or cyclic alkyl group having 1 to 10 carbon atoms;

$R^{334}$ and $R^{335}$ are each independently an alkyl group having 1 to 20 carbon atoms, an aryl group having 6 to 20 carbon atoms, or an aralkyl group having 7 to 20 carbon atoms, wherein some of hydrogen atoms of the group may be each substituted by a halogen atom, and wherein the group may have one or more polar functional groups such as an ether, carbonyl, ester, alcohol, sulfide, nitrile, amine, imine, amide, or the like; and $R^{334}$ and $R^{335}$ may be bonded to each other to form a hetero ring or heteroaromatic ring having 2 to 20 carbon atoms.

Further, it is also possible to utilize amine oxide compounds, which are oxides of the above described amine compounds, respectively, Note that application of amine oxides as basic compounds is disclosed in Japanese Patent Application Laid-open (kokai) No. 2008-102383. Among them, amine compounds represented by the following general formula (4) and amine oxide compounds, which are oxides thereof, can be desirably used combinedly with the above described amine compounds or amine oxide compounds having a carboxyl group and having no hydrogen atoms covalently bonded to a nitrogen atom as a basic center:

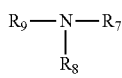

(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

The blending amount of the component (C) is preferably 0.01 to 2 parts (weight parts; and so forth), particularly 0.01 to 1 part relative to 100 parts of the base resin as the component (A). Excessively small amounts fail to exhibit blending effects, and excessively large amounts occasionally lead to excessively deteriorated sensitivities.

To desirably achieve the effect of the present invention, it is preferable to blend the component (C) at a blending ratio (weight/weight) in a range of 100:0 to 20:80 between (i) the above described amine compounds or amine oxide compounds having a carboxyl group and having no hydrogen atoms covalently bonded to a nitrogen atom as a basic center, and (ii) the other amine compounds or amine oxide compounds. Further, to achieve a higher level of obtainment of a stable resist pattern with a higher precision even under fluctuations such as in standing periods of time until exposure after formation of resist films, and in conditions of heating before exposure (prebaking), the amine compounds or amine oxide compounds having a carboxyl group and having no hydrogen atoms covalently bonded to a nitrogen atom as a basic center, are to be preferably added in amounts of 40 weight % or more of the total basic compounds.

To improve a coatability of the resist composition of the present invention, it is possible to add thereto a conventional surfactant (D), as an optional component in addition to the above enumerated components. Note that the optional component may be added in an ordinary amount within a range, which does not obstruct the effect of the present invention.

Examples of surfactants include, without particular limitation, polyoxyethylene alkyl ethers such as polyoxyethylene lauryl ether, polyoxyethylene stearyl ether, polyoxyethylene cetyl ether, and polyoxyethylene olein ether;

polyoxyethylene alkyl alyl ethers such as polyoxyethylene octyl phenol ether, and polyoxyethylene nonyl phenol ether;

polyoxyethylene polyoxypropylene block copolymers;

sorbitan fatty acid esters such as sorbitan monolaurate, sorbitan monopalmitate, and sorbitan monostearate;

nonionic surfactants of polyoxyethylene sorbitan fatty acid ester, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate;

fluorinated surfactants such as F TOP EF301, EF303, EF352 (produced by JEMCO Inc.), MEGAFAC F171, F172, F173, R08, R30, R90, R94 (produced by Dai-Nippon Ink & Chemicals, Inc.), Fluorad FC-430, FC-431, FC-4430, FC-4432 (produced by Sumitomo 3M Co., Ltd.), ASAHIGUARD AG710, SURFLON S-381, S-382, S-386, SC101, SC102, SC103, SC104, SC105, SC106, SURFINOL E1004, KH-10, KH-20, KH-30, KH-40 (produced by Asahi Glass Co.,);

organosiloxane polymers KP341, X-70-092, X-70-093 (produced by Shin-Etsu Chemical Co., Ltd.); and acrylic or methacrylic POLYFLOW No. 75, No. 95 (produced by Kyoeisha Yushi Kagaku Kogyo Co., Ltd.); and those surfactants are also preferably used, which are partially fluorinated oxetane ring-opening polymers having the following structure:

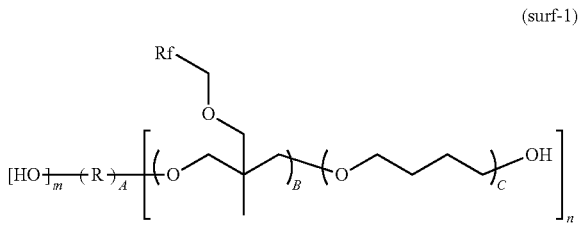

(surf-1)

wherein R, Rf, A, B, C, m, and n are applied to the formula (surf-1) only, irrespectively of the above descriptions unrelated to surfactants. R represents an aliphatic group having valence of 2 to 4 and having 2 to 5 carbon atoms, and concrete examples thereof include: 1,4-butylene, 1,2-propylene, 2,2-dimethyl-1,3-propylene, 1,5-pentylene as divalent ones; and those represented by the following formulae, as trivalent and tetravalent ones:

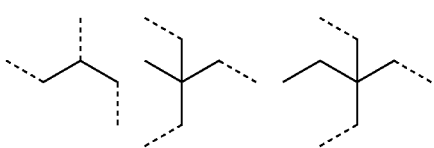

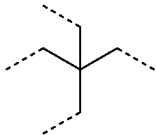

wherein broken lines represent bonding hands, and the structures are partial ones derived from glycerol, trimethylolethane, trimethylolpropane, and pentaerythritol, respectively.

To be preferably used among them are 1,4-butylene, and 2,2-dimethyl-1,3-propylene. Rf is a trifluoromethyl group or pentafluoroethyl group, and the trifluoromethyl group is preferable. m is an integer of 0 to 3, n is an integer of 1 to 4, and the sum of n and m indicates a valence of R and is an integer of 2 to 4. A is 1, B represents an integer of 2 to 25, and C represents an integer of 0 to 10. Preferably, B represents an integer of 4 to 20, and C represents an integer of 0 to 1. Further, constitutional units in the above structures do not define the order of them, and may be bonded in a block or random manner. Production of surfactants based on partially fluorinated oxetane ring-opening polymers, is detailed in U.S. Pat. No. 5,650,483. Desirable among them are, FC-4430, SURFLON S-381, SURFINOL E1004, KH-20, KH-30, and the oxetane ring-opening polymers represented by the structural formula. These can be used solely, or mixedly in two or more kinds.

The addition amount of the surfactant in the chemically amplified resist composition of the present invention, is 2 parts or less, and preferably 1 part or less, relative to 100 parts of the base resin (A) in the resist composition.

The formation of a resist film onto a processing substrate by using the resist composition of the present invention, is carried out through a step of coating the resist composition onto the processing substrate, and a subsequent prebaking step, and these steps can be conducted by known methods, respectively, to form resist films having thicknesses of 10 to 2,000 nm depending on purposes.

Although some methods are known as the coating step in addition to spin coating, the spin coating is most desirable in order to obtain a uniform film thickness in case of forming resist films having thicknesses of about 150 nm, or thinner.

When the processing substrate is a semiconductor wafer, coating conditions upon spin coating are required to be adjusted such as depending on the size of the wafer, a targeted film thickness, composition of the resist composition, and the like. In case of obtaining a resist film thickness of about 100 nm by adopting an 8-inch wafer (diameter of 200 mm), the resist composition is to be cast onto the wafer, followed by rotation thereof at a revolution speed of 4,000 to 5,000 rpm for 40 seconds, thereby enabling obtainment of a resist film higher in uniformity. Here, the usage amount of a solvent to be used upon preparation of the resist composition is 1,400 to 1,600 parts relative to 100 parts of the base resin.

Further, the resist film obtained in the above manner is subjected to prebaking, so as to remove an excessive solvent remaining in the film. The conditions of prebaking are typically 80 to 130° C. for 1 to 10 minutes, more desirably at 90 to 110° C. for 3 to 5 minutes, upon conduction on a hot plate.

When the processing substrate is a photomask blank, coating conditions are also required to be adjusted such as depending on the size of the blank, a targeted film thickness, composition of the resist composition, and the like. In case of obtaining a resist film thickness of about 100 nm on a rectangular blank of 15.2 cm×15.2 cm, the resist composition is to be cast onto the blank, followed by rotation thereof at a revolution speed of 1,500 to 3,000 rpm for 2 seconds and a subsequent rotation at 800 rpm or less for 30 seconds, thereby enabling obtainment of a film higher in uniformity. Here, the usage amount of a solvent to be used upon preparation of the resist composition is 2,000 to 2,700 parts relative to 100 parts of the base resin.

Further, the resist film obtained in the above manner is subjected to prebaking, so as to remove an excessive solvent remaining in the film. The conditions of prebaking are typically 80 to 130° C. for 4 to 20 minutes, more desirably at 90 to 110° C. for 8 to 12 minutes, upon conduction on a hot plate.

Next, pattern exposure is conducted for the above obtained resist film, for formation of an intended pattern. As an exposure method in case of working a semiconductor, there is held up a mask for forming the intended pattern above the resist film, followed by irradiation thereonto of high energy radiation such as deep ultraviolet rays, excimer laser, X-rays, or the like, or irradiation of electron beam, at an exposure value of 1 to 100 µC/cm$^2$, preferably 10 to 100 µC/cm$^2$. In addition to the typical exposure method, it is also possible to adopt an immersion method for exposure in a manner to achieve liquid immersion between a projection lens and a resist as required.

Further, in case of working a photomask blank, this is not to produce identical items, so that pattern exposure is typically conducted by beam exposure. Although the high energy radiation to be used is typically an electron beam, those high energy radiations are also usable, which include beams from the above-described and other light sources.

To conduct a chemical amplification reaction by diffusing acids typically after exposure, there is conducted post-exposure bake (PEB) at 60 to 150° C. for 4 to 20 minutes, and preferably at 80 to 140° C. for 8 to 12 minutes, on a hot plate, for example. There is then formed an intended pattern on the substrate by development in a usual manner such as a dipping, puddling, spraying method, or the like for 0.1 to 3 minutes, and preferably 0.5 to 2 minutes, by adopting 0.1 to 5 weight %, preferably 2 to 3 weight % of an aqueous alkaline developer such as tetramethylammonium hydroxide (TMAH). It is also possible to conduct a further heat treatment after development to thereby conduct a pattern size adjustment (i.e., thermal flow), as required. Note that the resist composition of the present invention is most suitable for fine patterning by deep ultraviolet rays or excimer laser at 250 to 120 nm, ultra-short ultraviolet, X-rays, and electron beams, among high energy radiations.

A Substrate to be processed of lithography, to which the resist patterning process of the present invention is to be applied, may be any substrates insofar as subjected to utilization of lithography based on photoresists, such as a semiconductor wafer, an intermediate substrate of semiconductor production, a photomask substrate, and the like, and the effect of the present invention can be advantageously obtained in case of a substrate having a film of metal compound thereon formed by a method such as sputtering. Among the above, the effect of the present invention is particularly useful in a photomask blank having an outermost surface carrying thereon a chromium compound film formed as a light-shielding film or etching mask film, because it is difficult to control a profile of a resist pattern near its boundary face on a chromium compound of a chromium compound film. Examples of chromium compounds as materials at outermost surfaces of substrates to which the present invention is desirably applied, include metal chromium, chromium oxide, chromium nitride, chromium carbide, chromium oxide nitride, chromium oxide carbide, chromium nitride carbide, chromium oxide nitride carbide, and the like.

EXAMPLES

The present invention will be concretely explained by describing Examples and Comparative Examples, concerning the resist composition including the amine compound or amine oxide compound having a carboxyl group and having no hydrogen atoms covalently bonded to a nitrogen atom as a basic center, without limited to the Examples.

Shown below are structural formulae of base resins (Polymers 1 and 2) and acid generators (PAG-1, 2) as constituent materials of resist compositions, used in the present invention. In the following Examples, Mw and Mn represent values determined relative to polystyrene standards, as measured by gel permeation chromatography (GPC).

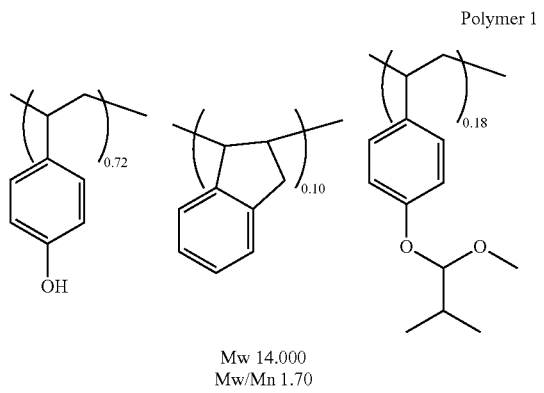

Polymer 1

Mw 14.000
Mw/Mn 1.70

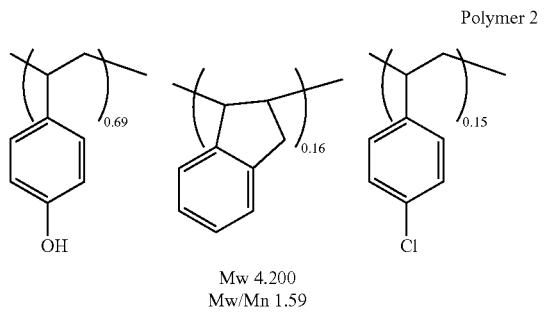

Polymer 2

Mw 4.200
Mw/Mn 1.59

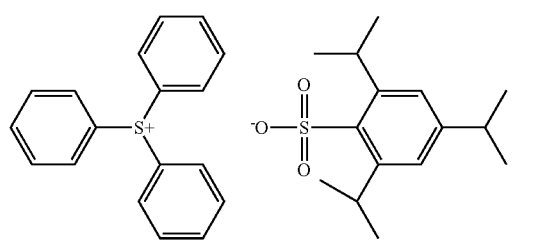

PAG-1

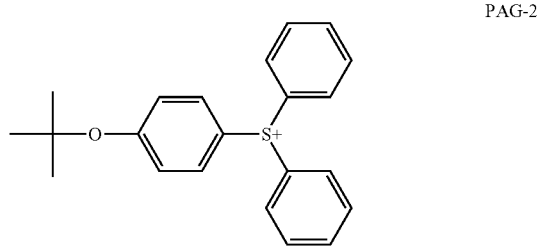

PAG-2

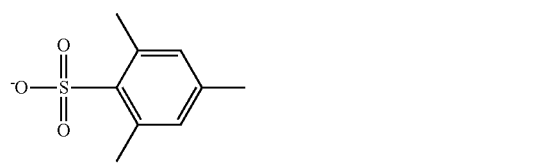

Solvent (A): propylene glycol methyl ether acetate (PGMEA)

Solvent (B): ethyl lactate (EL)

Further, the following compounds are amine compounds or amine oxide compounds having a carboxyl group and having no hydrogen atoms covalently bonded to a nitrogen atom as a basic center, and other inapplicable basic compounds (Quenchers), used in Examples and Comparative Examples, respectively.

Quencher-1: m-dimethylaminobenzoic acid

Quencher-2: p-diethylaminobenzoic acid

Quencher-3: p-dibutylaminobenzoic acid

Quencher-4: p-dihexylaminobenzoic acid

Quencher-5: 2-(4-(dibutylamino)-2-hydroxybenzoyl)benzoic acid

Quencher-6: 4-(dimethylamino)phenylacetic acid

Quencher-7: 1-piperidinepropionic acid

Quencher-9: p-aminobenzoic acid*

Quencher-9': 2-quinolinecarboxylic acid*

Quencher-10: tris(2-(methoxymethoxy)ethyl)amine*

Quencher-11: oxide of tris(2-(methoxymethoxy)ethyl)amine*

Quencher-12: tetrabutylammonium acetate*

Quencher-13: 2-(4-morpholinyl)ethyl octanoate*

Quencher-14: 2-(1H-benzoimidazole-1-yl)ethyl benzoate*

Quencher-15: oxide of m-dimethylaminobenzoic acid

Quencher-16: oxide of p-diethylaminobenzoic acid

Quencher-17: oxide of p-dibutylaminobenzoic acid

Quencher-18: oxide of p-dihexylaminobenzoic acid

*basic compound other than: "amine compound having a carboxyl group and having no hydrogen atoms covalently bonded to a nitrogen atom as a basic center"; and "oxide of the amine compound"

Surfactant A: KH-20 (produced by Asahi Glass Co.,)

Surfactant B: PF-636 (produced by Omnova Solutions Inc.)

Crosslinking agent 1: tetramethoxymethylglycoluril

Examples 1 to 6, and Comparative Examples 1 to 3

Resist compositions listed in Table 1 were dissolved in the listed solvents, respectively, and the obtained resist compositions were each filtered by a filter of 0.04 μm size made of nylon resin, followed by spin coating of each resist solution at a revolution speed of 2,500 rpm onto a mask blank of 152 mm square having an outermost surface made of chromium oxide nitride, into a coated thickness of 150 nm. Next, each mask blank was baked for 10 minutes by a hot plate at 90° C. Measurement of a thickness of each obtained resist film was conducted by an optical measurement device NanoSpec (manufactured by Nanometrics Incorporated). The measurement was conducted at 81 in-plane points of an applicable blank substrate except for an outer peripheral region from an outer edge to an inner extent at a distance of 10 mm therefrom, so as to calculate an averaged film thickness and a film thickness range.

TABLE 1

| Composition (weight part) | Ex. 1 | Ex. 2 | Ex. 3 | Ex. 4 | Ex. 5 | Ex. 6 | Com. Ex. 1 | Com. Ex. 2 | Com. Ex. 3 |
|---|---|---|---|---|---|---|---|---|---|
| polymer-1 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Quencher-1 | 0.2 | — | — | — | — | — | — | — | — |
| Quencher-2 | — | 0.2 | — | — | 0.1 | 0.1 | — | — | — |
| Quencher-3 | — | — | 0.2 | — | — | 0.1 | — | — | — |
| Quencher-4 | — | — | — | 0.2 | 0.1 | — | — | — | — |
| Quencher-9 | — | — | — | — | — | — | 0.2 | — | — |
| Quencher-9' | — | — | — | — | — | — | — | 0.2 | — |
| Quencher-11 | — | — | — | — | — | — | — | — | 0.2 |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 1,100 | 1,100 | 1,100 | 1,100 | 1,100 | 1,100 | 1,100 | 1,100 | 1,100 |

Further, exposure was conducted by an electron beam exposure apparatus (EBM5000 Acceleration Voltage 50 keV manufactured by NuFLARE Technology, Inc.), followed by conduction of baking (PEB: post-exposure baking) at 110° C. for 10 minutes and subsequent development by aqueous solution of 2.38% tetramethylammonium hydroxide, thereby allowing for obtainment of positive patterns (Examples 1 to 6, and Comparative Examples 1 to 3).

The obtained resist patterns were evaluated in the following manner. Assuming that an exposure value for resolving top and bottom of a 200 nm line-and-space pattern at a resolution of 1:1 was an optimum exposure value (sensitivity: Eop), a minimum line width of the line-and-space pattern found to be separated at this exposure value was defined to be a resolution of the applicable evaluated resist. Further, the profile of each resolved resist pattern was observed at a cross-section of the resist by a scanning electron microscope, particularly in terms of presence or absence of footing at a substrate-side boundary face of resist.

For line edge roughness, 3σ was calculated by measuring 50 points over 5 μm in a longitudinal direction of a 100 nm line pattern (S-8840 manufactured by Hitachi, Ltd.). Smaller values represent better performances. For prebaking temperature dependency, there was measured a pattern dimension change when the prebaking temperature was raised by 10° C. Further, there was calculated a pattern dimension change amount per 1° C.

Shown in Table 2 are evaluation results of resolution, pattern cross-sectional profile, line edge roughness, and prebaking temperature dependency. Although footing was not overcome in case of p-aminobenzoic acid having a hydrogen atom covalently bonded to a nitrogen atom as a basic center (Comparative Example 1), 2-quinolinecarboxylic acid having a nitrogen atom included in an aromatic ring (Comparative Example 2), and an oxide of tris(2-(methoxymethoxy)ethyl) amine containing no carboxyl groups (Comparative Example 3), excellent pattern profiles without footing were obtained in Examples 1 through 6. Although Example 1 exhibited a larger prebaking temperature dependency, its resolution, cross-sectional profile, and line edge roughness were within allowable ranges, respectively.

TABLE 2

| | Resolution (μm) | Cross-sectional profile (footing) | Line edge roughness (nm) | Prebaking temperature dependency (nm/° C.) |
|---|---|---|---|---|
| Ex. 1 | 0.07 | Good | 4 | 3 |
| Ex. 2 | 0.07 | Good | 4 | 0.5 or less |
| Ex. 3 | 0.07 | Good | 4 | 0.5 or less |
| Ex. 4 | 0.07 | Good | 4 | 0.5 or less |
| Ex. 5 | 0.07 | Good | 4 | 0.5 or less |
| Ex. 6 | 0.07 | Good | 4 | 0.5 or less |
| Com. Ex. 1 | 0.10 | Presence of footing | 5 | 3 |
| Com. Ex. 2 | 0.09 | Presence of footing | 5 | 1 |
| Com. Ex. 3 | 0.09 | Presence of footing | 5 | 0.5 or less |

Example 7 to Example 15

Resist compositions listed in Table 3 were prepared, which included the amine compound having a carboxyl group and having no hydrogen atoms covalently bonded to a nitrogen atom as a basic center of the present invention, and the conventional amine compounds, and the patterning process of the present invention was performed for them in the same manner as Examples 1 through 6 to conduct evaluation of resolutions and pattern profiles thereof. Results thereof are listed in Table 4. In all Examples, excellent resolutions, pattern profiles without footing, and excellent line edge roughness were obtained.

TABLE 3

| Composition (weight part) | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|
| polymer-1 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Quencher-2 | 0.1 | 0.1 | 0.1 | 0.1 | 0.1 | 0.1 | 0.1 | 0.1 | 0.1 |
| Quencher-10 | 0.1 | — | — | — | — | 0.05 | — | — | — |
| Quencher-11 | — | 0.1 | — | — | — | — | 0.05 | 0.05 | 0.05 |

TABLE 3-continued

| Composition (weight part) | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|
| Quencher-12 | — | — | 0.1 | — | | | | — | 0.05 |
| Quencher-13 | — | — | — | 0.1 | — | 0.05 | — | 0.05 | — |
| Quencher-14 | — | — | — | — | 0.1 | — | 0.05 | — | — |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 1,100 | 1,100 | 1,100 | 1,100 | 1,100 | 1,100 | 1,100 | 1,100 | 1,100 |

TABLE 4

| | Resolution (μm) | Cross-sectional profile (footing) | Line edge roughness (nm) | Prebaking temperature dependency (nm/° C.) |
|---|---|---|---|---|
| Ex. 7 | 0.07 | Good | 4 | 0.5 or less |
| Ex. 8 | 0.07 | Good | 3 | 0.5 or less |
| Ex. 9 | 0.07 | Good | 4 | 0.5 or less |
| Ex. 10 | 0.07 | Good | 4 | 0.5 or less |
| Ex. 11 | 0.07 | Good | 3 | 0.5 or less |
| Ex. 12 | 0.07 | Good | 4 | 0.5 or less |
| Ex. 13 | 0.07 | Good | 3 | 0.5 or less |
| Ex. 14 | 0.07 | Good | 4 | 0.5 or less |
| Ex. 15 | 0.07 | Good | 3 | 0.5 or less |

Example 16 to Example 24

Resist compositions listed in Table 5 were prepared, which included the amine compound having a carboxyl group and having no hydrogen atoms covalently bonded to a nitrogen atom as a basic center of the present invention, and the patterning process of the present invention was performed for them in the same manner as Examples 1 through 6 to conduct evaluation of resolutions and pattern profiles thereof. Results thereof are listed in Table 6. Excellent results were obtained here also, similarly to the above.

TABLE 5

| Composition (weight part) | Ex. 16 | Ex. 17 | Ex. 18 | Ex. 19 | Ex. 20 | Ex. 21 | Ex. 22 | Ex. 23 | Ex. 24 |
|---|---|---|---|---|---|---|---|---|---|
| polymer-1 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Quencher-5 | 0.2 | — | — | — | 0.1 | — | 0.1 | — | — |
| Quencher-6 | — | 0.2 | — | 0.1 | — | 0.1 | — | — | — |
| Quencher-7 | — | — | 0.2 | — | — | — | — | 0.1 | 0.1 |
| Quencher-10 | — | — | — | — | — | 0.1 | 0.1 | — | 0.1 |
| Quencher-11 | — | — | — | 0.1 | 0.1 | — | — | 0.1 | — |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 1,100 | 1,100 | 1,100 | 1,100 | 1,100 | 1,100 | 1,100 | 1,100 | 1,100 |

TABLE 6

| | Resolution (μm) | Cross-sectional profile (footing) | Line edge roughness (nm) | Prebaking temperature dependency (nm/° C.) |
|---|---|---|---|---|
| Ex. 16 | 0.07 | Good | 4 | 0.5 or less |
| Ex. 17 | 0.07 | Good | 3 | 0.5 or less |
| Ex. 18 | 0.07 | Good | 4 | 0.5 or less |
| Ex. 19 | 0.07 | Good | 4 | 0.5 or less |
| Ex. 20 | 0.07 | Good | 3 | 0.5 or less |
| Ex. 21 | 0.07 | Good | 4 | 0.5 or less |
| Ex. 22 | 0.07 | Good | 3 | 0.5 or less |
| Ex. 23 | 0.07 | Good | 4 | 0.5 or less |
| Ex. 24 | 0.07 | Good | 3 | 0.5 or less |

Examples 25 to 30, Comparative Examples 4 to 6

Chemically amplified negative resist compositions listed in Table 7 were prepared, which included the amine compound having a carboxyl group and having no hydrogen atoms covalently bonded to a nitrogen atom as a basic center of the present invention, and the patterning process of the present invention was then performed for them to conduct evaluation of resolutions and pattern profiles thereof.

The patterning process was conducted in the same manner as Example 1, after coating each resist solution onto a mask blank by spin. Shown in Table 8 are evaluation results of resolution, pattern cross-sectional profile (presence or absence of undercut), line edge roughness, and prebaking temperature dependency.

TABLE 7

| Composition (weight part) | Ex. 25 | Ex. 26 | Ex. 27 | Ex. 28 | Ex. 29 | Ex. 30 | Com. Ex. 4 | Com. Ex. 5 | Com. Ex. 6 |
|---|---|---|---|---|---|---|---|---|---|
| polymer-2 | 80 | 80 | 80 | 80 | 80 | 80 | 80 | 80 | 80 |
| PAG-1 | 8 | 8 | 8 | 8 | 8 | 8 | 8 | 8 | 8 |
| PAG-2 | 2 | 2 | 2 | 2 | 2 | 2 | 2 | 2 | 2 |
| Cross-linking agent 1 | 8.2 | 8.2 | 8.2 | 8.2 | 8.2 | 8.2 | 8.2 | 8.2 | 8.2 |
| Quencher-1 | 0.2 | — | — | — | — | — | — | — | — |
| Quencher-2 | — | 0.2 | — | — | 0.1 | 0.1 | — | — | — |
| Quencher-3 | — | — | 0.2 | — | — | 0.1 | — | — | — |
| Quencher-4 | — | — | — | 0.2 | 0.1 | — | — | — | — |
| Quencher-9 | — | — | — | — | — | — | 0.2 | — | — |
| Quencher-9' | — | — | — | — | — | — | — | 0.2 | — |
| Quencher-10 | — | — | — | — | — | — | — | — | 0.2 |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 800 | 800 | 800 | 800 | 800 | 800 | 800 | 800 | 800 |

TABLE 8

|  | Resolution (μm) | Cross-sectional profile (undercut) | Line edge roughness (nm) | Prebaking temperature dependency (nm/° C.) |
|---|---|---|---|---|
| Ex. 25 | 0.07 | Good | 4 | 3 |
| Ex. 26 | 0.07 | Good | 4 | 0.5 or less |
| Ex. 27 | 0.07 | Good | 4 | 0.5 or less |
| Ex. 28 | 0.07 | Good | 4 | 0.5 or less |
| Ex. 29 | 0.07 | Good | 4 | 0.5 or less |
| Ex. 30 | 0.07 | Good | 4 | 0.5 or less |
| Com. Ex. 4 | 0.12 | Presence of undercut | 5 | 3 |
| Com. Ex. 5 | 0.10 | Presence of undercut | 5 | 1 |
| Com. Ex. 6 | 0.10 | Presence of undercut | 5 | 0.5 or less |

From the above result, it was proven that adoption of the resist composition of the present invention allowed for assurance of an expected prebaking temperature dependency and for obtainment of an improved cross-sectional profile, particularly a fine pattern without undercut at a substrate-side boundary face of resist, also in case of the chemically amplified negative resist compositions, identically to the positive resists. In Comparative Examples, fine patterns were collapsed due to undercut.

Example 31 to Example 39

Resist compositions listed in Table 9 were prepared, which included the amine compound having a carboxyl group and having no hydrogen atoms covalently bonded to a nitrogen atom as a basic center of the present invention, and the conventional amine compounds, and the patterning process of the present invention was performed for them in the same manner as Examples 25 through 30 to conduct evaluation of resolutions and pattern profiles thereof. As listed in Table 10, pattern profiles were obtained without undercut, together with excellent resolutions and line edge roughness, in all Examples.

TABLE 9

| Composition (weight part) | Ex. 31 | Ex. 32 | Ex. 33 | Ex. 34 | Ex. 35 | Ex. 36 | Ex. 37 | Ex. 38 | Ex. 39 |
|---|---|---|---|---|---|---|---|---|---|
| polymer-2 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Cross-linking agent 1 | 8.2 | 8.2 | 8.2 | 8.2 | 8.2 | 8.2 | 8.2 | 8.2 | 8.2 |
| Quencher-2 | 0.1 | 0.1 | 0.1 | 0.1 | 0.1 | 0.1 | 0.1 | 0.1 | 0.1 |
| Quencher-10 | 0.1 | — | — | — | — | 0.05 | — | — | — |
| Quencher-11 | — | 0.1 | — | — | — | — | 0.05 | 0.05 | 0.05 |
| Quencher-12 | — | — | 0.1 | — | — | — | — | — | 0.05 |
| Quencher-13 | — | — | — | 0.1 | — | 0.05 | — | 0.05 | — |
| Quencher-14 | — | — | — | — | 0.1 | — | 0.05 | — | — |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 800 | 800 | 800 | 800 | 800 | 800 | 800 | 800 | 800 |

TABLE 10

| | Resolution (μm) | Cross-sectional profile (undercut) | Line edge roughness (nm) | Prebaking temperature dependency (nm/° C.) |
|---|---|---|---|---|
| Ex. 31 | 0.07 | Good | 4 | 0.5 or less |
| Ex. 32 | 0.07 | Good | 3 | 0.5 or less |
| Ex. 33 | 0.07 | Good | 4 | 0.5 or less |
| Ex. 34 | 0.07 | Good | 4 | 0.5 or less |
| Ex. 35 | 0.07 | Good | 3 | 0.5 or less |
| Ex. 36 | 0.07 | Good | 4 | 0.5 or less |
| Ex. 37 | 0.07 | Good | 3 | 0.5 or less |
| Ex. 38 | 0.07 | Good | 4 | 0.5 or less |
| Ex. 39 | 0.07 | Good | 3 | 0.5 or less |

Example 40 to Example 48

Resist compositions listed in Table 11 were prepared, which included the amine compound having a carboxyl group and having no hydrogen atoms covalently bonded to a nitrogen atom as a basic center of the present invention, and the patterning process of the present invention was performed for them in the same manner as Examples 25 through 30 to conduct evaluation of resolutions and pattern profiles thereof. Results thereof are listed in Table 12. Excellent results were obtained here also, similarly to the above.

TABLE 11

| Composition (weight part) | Ex. 40 | Ex. 41 | Ex. 42 | Ex. 43 | Ex. 44 | Ex. 45 | Ex. 46 | Ex. 47 | Ex. 48 |
|---|---|---|---|---|---|---|---|---|---|
| polymer-2 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Crosslinking agent 1 | 8.2 | 8.2 | 8.2 | 8.2 | 8.2 | 8.2 | 8.2 | 8.2 | 8.2 |
| Quencher-5 | 0.2 | — | — | — | 0.1 | — | 0.1 | — | — |
| Quencher-6 | — | 0.2 | — | 0.1 | — | 0.1 | — | — | — |
| Quencher-7 | — | — | 0.2 | — | — | — | — | 0.1 | 0.1 |
| Quencher-10 | — | — | — | — | — | 0.1 | 0.1 | — | 0.1 |
| Quencher-11 | — | — | — | 0.1 | 0.1 | — | — | 0.1 | — |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 800 | 800 | 800 | 800 | 800 | 800 | 800 | 800 | 800 |

TABLE 12

| | Resolution (μm) | Cross-sectional profile (undercut) | Line edge roughness (nm) | Prebaking temperature dependency (nm/° C.) |
|---|---|---|---|---|
| Ex. 40 | 0.07 | Good | 4 | 0.5 or less |
| Ex. 41 | 0.07 | Good | 3 | 0.5 or less |
| Ex. 42 | 0.07 | Good | 4 | 0.5 or less |
| Ex. 43 | 0.07 | Good | 4 | 0.5 or less |
| Ex. 44 | 0.07 | Good | 3 | 0.5 or less |
| Ex. 45 | 0.07 | Good | 4 | 0.5 or less |
| Ex. 46 | 0.07 | Good | 3 | 0.5 or less |
| Ex. 47 | 0.07 | Good | 4 | 0.5 or less |
| Ex. 48 | 0.07 | Good | 3 | 0.5 or less |

Example 26, and Example 49 to Example 51

Resist compositions listed in Table 13 were each prepared based on Example 26 in a manner to vary an amount of Quencher-2: p-diethylaminobenzoic acid, i.e., the amine compound having a carboxyl group and having no hydrogen atoms covalently bonded to a nitrogen atom as a basic center of the present invention, and the patterning process of the present invention was performed for them in the same manner as Examples 25 through 30 to conduct evaluation of resolutions, pattern profiles, edge roughness, and electron beam sensitivity thereof, Results thereof are listed in Table 14.

TABLE 13

| Composition (weight part) | Ex. 26 | Ex. 49 | Ex. 50 | Ex. 51 |
|---|---|---|---|---|
| polymer-2 | 80 | 80 | 80 | 80 |
| PAG-1 | 8 | 8 | 8 | 8 |
| PAG-2 | 2 | 2 | 2 | 2 |
| Crosslinking agent 1 | 8.2 | 8.2 | 8.2 | 8.2 |
| Quencher-2 | 0.2 | 0.5 | 1.0 | 1.5 |
| Surfactant A | 0.07 | 0.07 | 0.07 | 0.07 |
| Solvent A | 470 | 470 | 470 | 470 |
| Solvent B | 800 | 800 | 800 | 800 |

TABLE 14

| | Resolution (μm) | Cross-sectional profile (undercut) | Line edge roughness (nm) | Electron beam sensitivity (μC/cm$^2$) |
|---|---|---|---|---|
| Ex. 26 | 0.07 | Good | 4 | 10 |
| Ex. 49 | 0.06 | Good | 3 | 14 |
| Ex. 50 | 0.05 | Good | 2 | 23 |
| Ex. 51 | 0.045 | Good | 1 | 36 |

Although increase of p-diethylaminobenzoic acid decreased electron beam sensitivity, resolution and edge roughness were remarkably improved. Since higher sensitivities are more excellent in view of throughput of mask production, it is understood that a material composition can be optimized based on a relationship among throughput, resolution, and edge roughness.

Example 52 to Example 57

Resist compositions listed in Table 15 were prepared, which included the amine compound having a carboxyl group and having no hydrogen atoms covalently bonded to a nitrogen atom as a basic center of the present invention, and the patterning process of the present invention was performed for them in the same manner as Examples 25 through 30 to conduct evaluation of resolutions and pattern profiles thereof. Results thereof are listed in Table 16. In all Examples, excellent pattern profiles were obtained, together with excellent resolutions and edge roughness. Further, Example 52 was obtained as a result of adopting an oxide of the amine used in Example 1, and the prebaking temperature dependency thereof (nm/° C.) was improved. It was assumed that oxidation of the amine caused the oxide to be scarcely evaporated from the resist film.

TABLE 15

| Composition (weight part) | Ex. 52 | Ex. 53 | Ex. 54 | Ex. 55 | Ex. 56 | Ex. 57 |
|---|---|---|---|---|---|---|
| polymer-2 | 80 | 80 | 80 | 80 | 80 | 80 |
| PAG-1 | 8 | 8 | 8 | 8 | 8 | 8 |
| PAG-2 | 2 | 2 | 2 | 2 | 2 | 2 |
| Crosslinking agent 1 | 8.2 | 8.2 | 8.2 | 8.2 | 8.2 | 8.2 |
| Quencher-15 | 0.2 | — | — | — | — | — |
| Quencher-16 | — | 0.2 | — | — | 0.2 | 0.2 |
| Quencher-17 | — | — | 0.2 | — | — | — |
| Quencher-18 | — | — | — | 0.2 | — | — |
| Quencher-10 | — | — | — | — | 0.2 | — |
| Quencher-11 | — | — | — | — | — | 0.2 |
| Surfactant A | 0.07 | 0.07 | 0.07 | 0.07 | 0.07 | 0.07 |
| Solvent A | 470 | 470 | 470 | 470 | 470 | 470 |
| Solvent B | 800 | 800 | 800 | 800 | 800 | 800 |

TABLE 16

| | Resolution (μm) | Cross-sectional profile (undercut) | Line edge roughness (nm) | Prebaking temperature dependency (nm/° C.) |
|---|---|---|---|---|
| Ex. 52 | 0.07 | Good | 4 | 2 |
| Ex. 53 | 0.07 | Good | 4 | 0.5 or less |
| Ex. 54 | 0.07 | Good | 4 | 0.5 or less |
| Ex. 55 | 0.07 | Good | 4 | 0.5 or less |
| Ex. 56 | 0.07 | Good | 4 | 0.5 or less |
| Ex. 57 | 0.07 | Good | 4 | 0.5 or less |

Example 58 to Example 63

Resist compositions listed in Table 17 were prepared, which included the amine compound having a carboxyl group and having no hydrogen atoms covalently bonded to a nitrogen atom as a basic center of the present invention, and the patterning process of the present invention was performed for them in the same manner as Examples 25 through 30 to conduct evaluation of resolutions and pattern profiles thereof. Here, the used surfactant B (PF-636) had the following structure. Results thereof are listed in Table 18.

Namely, the surfactant was 3-methyl-3-(2,2,2-trifluoroethoxymethyl)oxetane/tetrahydrofuran/2,2-dimethyl-1,3-propanediol copolymer (produced by Omnova Solutions Inc.).

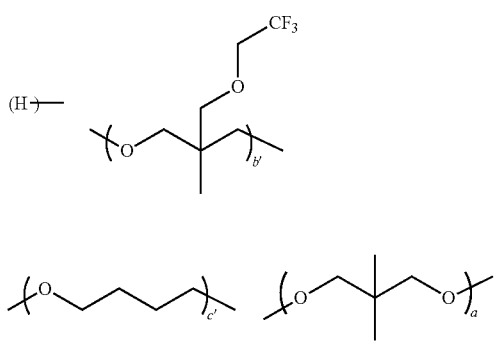

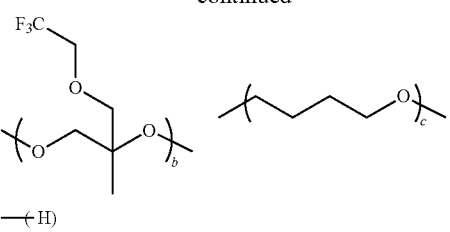

wherein
a:(b+b'):(c+c')=1:4 to 7:0.01 to 1 (molar ratio), and
weight-average molecular weight: 1,500.

TABLE 17

| Composition (weight part) | Ex. 58 | Ex. 59 | Ex. 60 | Ex. 61 | Ex. 62 | Ex. 63 |
|---|---|---|---|---|---|---|
| polymer-2 | 80 | 80 | 80 | 80 | 80 | 80 |
| PAG-1 | 8 | 8 | 8 | 8 | 8 | 8 |
| PAG-2 | 2 | 2 | 2 | 2 | 2 | 2 |
| Crosslinking agent 1 | 8.2 | 8.2 | 8.2 | 8.2 | 8.2 | 8.2 |
| Quencher-15 | 0.2 | — | — | — | — | — |
| Quencher-16 | — | 0.2 | — | — | 0.2 | 0.2 |
| Quencher-17 | — | — | 0.2 | — | — | — |
| Quencher-18 | — | — | — | 0.2 | — | — |
| Quencher-10 | — | — | — | — | 0.2 | — |
| Quencher-11 | — | — | — | — | — | 0.2 |
| Surfactant B | 0.07 | 0.07 | 0.07 | 0.07 | 0.07 | 0.07 |
| Solvent A | 470 | 470 | 470 | 470 | 470 | 470 |
| Solvent B | 800 | 800 | 800 | 800 | 800 | 800 |

TABLE 18

| | Resolution (μm) | Cross-sectional profile (undercut) | Line edge roughness (nm) | Prebaking temperature dependency (nm/° C.) |
|---|---|---|---|---|
| Ex. 58 | 0.07 | Good | 4 | 2 |
| Ex. 59 | 0.07 | Good | 4 | 0.5 or less |
| Ex. 60 | 0.07 | Good | 4 | 0.5 or less |
| Ex. 61 | 0.07 | Good | 4 | 0.5 or less |
| Ex. 62 | 0.07 | Good | 4 | 0.5 or less |
| Ex. 63 | 0.07 | Good | 4 | 0.5 or less |

Also from the results, excellent pattern profiles were obtained in addition to excellent resolutions and line edge roughness, identically to above-described Examples.

Example 64 to Example 72

Resist compositions listed in Table 19 were prepared, which included the amine compound having a carboxyl group and having no hydrogen atoms covalently bonded to a nitrogen atom as a basic center of the present invention, and the conventional amine compounds, and the patterning process of the present invention was performed for them in the same manner as Examples 25 through 30 to conduct evaluation of resolutions and pattern profiles thereof. Results thereof are listed in Table 20.

TABLE 19

| Composition (weight part) | Ex. 64 | Ex. 65 | Ex. 66 | Ex. 67 | Ex. 68 | Ex. 69 | Ex. 70 | Ex. 71 | Ex. 72 |
|---|---|---|---|---|---|---|---|---|---|
| polymer-2 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Crosslinking agent 1 | 8.2 | 8.2 | 8.2 | 8.2 | 8.2 | 8.2 | 8.2 | 8.2 | 8.2 |
| Quencher-3 | 0.1 | 0.1 | 0.1 | 0.1 | 0.1 | 0.1 | 0.1 | 0.1 | 0.1 |
| Quencher-10 | 0.1 | — | — | — | — | 0.05 | — | — | — |
| Quencher-11 | — | 0.1 | — | — | — | — | 0.05 | 0.05 | 0.05 |
| Quencher-12 | — | — | 0.1 | — | — | — | — | — | 0.05 |
| Quencher-13 | — | — | — | 0.1 | — | 0.05 | — | 0.05 | — |
| Quencher-14 | — | — | — | — | 0.1 | — | 0.05 | — | — |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 800 | 800 | 800 | 800 | 800 | 800 | 800 | 800 | 800 |

TABLE 20

| | Resolution (μm) | Cross-sectional profile (undercut) | Line edge roughness (nm) | Prebaking temperature dependency (nm/° C.) |
|---|---|---|---|---|
| Ex. 64 | 0.07 | Good | 4 | 0.5 or less |
| Ex. 65 | 0.07 | Good | 3 | 0.5 or less |
| Ex. 66 | 0.07 | Good | 4 | 0.5 or less |
| Ex. 67 | 0.07 | Good | 4 | 0.5 or less |
| Ex. 68 | 0.07 | Good | 3 | 0.5 or less |
| Ex. 69 | 0.07 | Good | 4 | 0.5 or less |
| Ex. 70 | 0.07 | Good | 3 | 0.5 or less |
| Ex. 71 | 0.07 | Good | 4 | 0.5 or less |
| Ex. 72 | 0.07 | Good | 3 | 0.5 or less |

As listed in Table 20, pattern profiles without undercut were obtained from all Examples, together with excellent resolutions and line edge roughness.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:

1. A chemically amplified resist composition comprising one or more kinds of amine oxide compounds, which are obtained by oxidization, at least having: a carboxyl group; no hydrogen atoms covalently bonded to a nitrogen atom as a basic center; and no nitrogen atom as part of an aromatic ring, wherein
the nitrogen atom of the amine oxide compound has three single bonds combined to different carbon atoms, respectively,
the amine oxide compounds are blended upon preparation of the resist composition, and
the chemically amplified resist composition further comprises, as main components:
(A2) a base resin, which is soluble in alkali and can be made insoluble in alkali with the aid of an acid catalyst, and/or a combination of a base resin with a crosslinking agent, the base resin is soluble in alkali and can be made insoluble in alkali via reaction with the crosslinking agent with the aid of an acid catalyst; and
(B) an acid generator.

2. The chemically amplified resist composition according to claim 1, wherein the amine oxide compound having a carboxyl group and having no hydrogen atoms covalently bonded to a nitrogen atom as a basic center is an amine oxide compound represented by the following general formula (2):

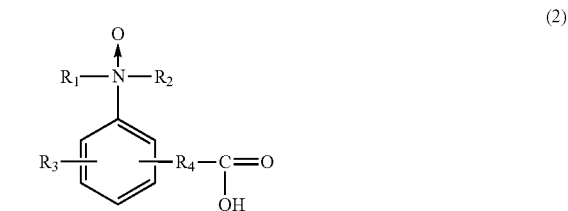

(2)

wherein $R_1$ and $R_2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms;
$R_1$ and $R_2$ may be bonded to each other to form a ring structure;
$R_3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, or a halogen group; and
$R_4$ is a single bond or a linear, branched, or cyclic alkylene group having 1 to 20 carbon atoms, or an arylene group having 6 to 20 carbon atoms.

3. The chemically amplified resist composition according to claim 1, wherein the chemically amplified resist composition further comprises one or more kinds of amine compounds each represented by the following general formula (4):

(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

4. The chemically amplified resist composition according to claim 2, wherein the chemically amplified resist composition further comprises one or more kinds of amine compounds each represented by the following general formula (4):

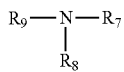

(4)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

5. The chemically amplified resist composition according to claim 1, wherein the chemically amplified resist composition further comprises one or more kinds of amine oxide compounds each represented by the following general formula (5):

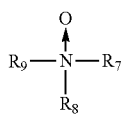

(5)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

6. The chemically amplified resist composition according to claim 2, wherein the chemically amplified resist composition further comprises one or more kinds of amine oxide compounds each represented by the following general formula (5):

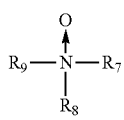

(5)

wherein $R_7$, $R_8$, and $R_9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, or an alkylthio-alkyl group having 1 to 10 carbon atoms; and two of $R_7$, $R_8$, and $R_9$ may be bonded to form a ring structure or an aromatic ring.

7. A resist patterning process comprising, at least, steps of:
coating the resist composition according to claim 1 onto a processing substrate, and heating the resist composition to eliminate an excessive solvent component remaining in the coated film, to obtain a resist film;
conducting pattern exposure on the resist film by high energy radiation; and
developing the resist film with a developer.

8. A resist patterning process comprising, at least, steps of:
coating the resist composition according to claim 2 onto a processing substrate, and heating the resist composition to eliminate an excessive solvent component remaining in the coated film, to obtain a resist film;
conducting pattern exposure on the resist film by high energy radiation; and
developing the resist film with a developer.

9. A resist patterning process comprising, at least, steps of:
coating the resist composition according to claim 3 onto a processing substrate, and heating the resist composition to eliminate an excessive solvent component remaining in the coated film, to obtain a resist film;
conducting pattern exposure on the resist film by high energy radiation; and
developing the resist film with a developer.

10. A resist patterning process comprising, at least, steps of:
coating the resist composition according to claim 4 onto a processing substrate, and heating the resist composition to eliminate an excessive solvent component remaining in the coated film, to obtain a resist film;
conducting pattern exposure on the resist film by high energy radiation; and
developing the resist film with a developer.

11. A resist patterning process comprising, at least, steps of
coating the resist composition according to claim 5 onto a processing substrate, and heating the resist composition to eliminate an excessive solvent component remaining in the coated film, to obtain a resist film;
conducting pattern exposure on the resist film by high energy radiation; and
developing the resist film with a developer.

12. A resist patterning process comprising, at least, steps of:
coating the resist composition according to claim 6 onto a processing substrate, and heating the resist composition to eliminate an excessive solvent component remaining in the coated film, to obtain a resist film;
conducting pattern exposure on the resist film by high energy radiation; and
developing the resist film with a developer.

13. The resist patterning process according to claim 7, wherein the processing substrate is a photomask blank formed with a chromium compound film.

14. The resist patterning process according to claim 8, wherein the processing substrate is a photomask blank formed with a chromium compound film.

15. The resist patterning process according to claim 9, wherein the processing substrate is a photomask blank formed with a chromium compound film.

16. The resist patterning process according to claim 10, wherein the processing substrate is a photomask blank formed with a chromium compound film.

17. The resist patterning process according to claim 11, wherein the processing substrate is a photomask blank formed with a chromium compound film.

18. The resist patterning process according to claim 12, wherein the processing substrate is a photomask blank formed with a chromium compound film.

19. A photomask blank having the resist film formed from the chemically amplified resist composition according to claim 1 thereon.

20. A photomask blank having the resist film formed from the chemically amplified resist composition according to claim 2 thereon.

21. A photomask blank having the resist film formed from the chemically amplified resist composition according to claim 3 thereon.

22. A photomask blank having the resist film formed from the chemically amplified resist composition according to claim 4 thereon.

23. A photomask blank having the resist film formed from the chemically amplified resist composition according to claim 5 thereon.

24. A photomask blank having the resist film formed from the chemically amplified resist composition according to claim 6 thereon.

25. The photomask blank according to claim 19, wherein the photomask blank has a chromium compound film at outermost surface.

26. The photomask blank according to claim 20, wherein the photomask blank has a chromium compound film at outermost surface.

27. The photomask blank according to claim 21, wherein the photomask blank has a chromium compound film at outermost surface.

28. The photomask blank according to claim 22, wherein the photomask blank has a chromium compound film at outermost surface.

29. The photomask blank according to claim 23, wherein the photomask blank has a chromium compound film at outermost surface.

30. The photomask blank according to claim 24, wherein the photomask blank has a chromium compound film at outermost surface.

\* \* \* \* \*